US007899091B2

(12) United States Patent
Roth et al.

(10) Patent No.: US 7,899,091 B2
(45) Date of Patent: Mar. 1, 2011

(54) DEFECT-TOLERANT DEMULTIPLEXERS BASED ON THRESHOLD LOGIC

(75) Inventors: Ron M. Roth, Haifa (IL); Joseph Warren Robinett, Chapel Hill, NC (US); Philip J. Kuekes, Menlo Park, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 197 days.

(21) Appl. No.: 12/288,035

(22) Filed: Oct. 15, 2008

(65) Prior Publication Data

US 2010/0091662 A1    Apr. 15, 2010

(51) Int. Cl.
*H04J 99/00*     (2009.01)
(52) U.S. Cl. .......................................... 370/546

(58) Field of Classification Search .................. 370/217, 370/242, 535, 546
See application file for complete search history.

(56) References Cited

OTHER PUBLICATIONS

Kuekes et al, ' Defect-tolerant interconnect to nanoelectronic circuits: internally redundant demultiplexers based on error-correcting codes' Quantum Science Research, Hewlett-Packard Labs, 1501 Page Mill Road, Palo Alto, CA 94304, USA, Published Apr. 19, 2005.*

* cited by examiner

*Primary Examiner* — Kevin C Harper
*Assistant Examiner* — Henry Baron

(57) ABSTRACT

Embodiments of the present invention include defect-tolerant demultiplexer crossbars that employ, or that can be modeled by demultiplexer crossbars that employ, threshold logic "TL" elements. The threshold-logic elements provide for tolerance for signal variation on internal signals lines of a defect-tolerant demultiplexer crossbar, and thus tolerance for defects which produce internal signal variation.

15 Claims, 18 Drawing Sheets

DEFECT-TOLERANT DEMULTIPLEXERS BASED ON THRESHOLD LOGIC

TECHNICAL FIELD

The present invention is related to electronic circuits employed in various different types of electronic devices, including microscale, sub-microscale, nanoscale, and mixed-scale devices, and, in particular, is directed to demultiplexers that can be economically produced to tolerate different types and numbers of internal defects.

BACKGROUND OF THE INVENTION

The enormous increase in computational power of electronic computers during the past half-century has been made possible by advances in many different fields, from materials science and manufacturing-process design to theoretical and applied physics and computer science. In general, the rapid increase in computational bandwidth and efficiency has been made possible by a relentless increase in the density at which electronic components, including transistors and signal lines, can be manufactured within integrated circuits. The sizes of electronic components are currently being reduced to the sub-microscale and nanoscale levels. As feature sizes decrease, current fabrication methods based on photolithography are being pushed toward fundamental physical limitations, at which point the probability of manufacturing defects has begun to significantly increase. For nanoscale features and components, entirely new manufacturing methods are being developed, including methods that rely on self-assembly of nanoscale and molecular-scale building blocks. These new methods are currently accompanied with significantly greater probabilities of the occurrences of defects of various kinds. Both conventional photolithographic manufacturing techniques and newer molecular-electronics manufacturing techniques are being improved and refined in order to lower defect rates, but lowering defect rates to a level where perfect or nearly perfect devices can be produced at reasonable yields is currently impractical. Instead, designers and manufacturers of electronic devices are striving to design and produce defect-tolerant electronic circuits and devices that can operate correctly even when the circuits and devices include a reasonable number of manufacturing defects. Thus, designers, manufacturers, and vendors of electronic devices and electronic circuits continue to seek design principles and manufacturing methods that lead to increased defect tolerance in electronic circuits and electronic devices.

SUMMARY OF THE INVENTION

Embodiments of the present invention include defect-tolerant demultiplexer crossbars that employ, or that can be modeled by demultiplexer crossbars that employ, threshold logic "TL" elements. The threshold-logic elements provide for tolerance for signal variation on internal signals lines of a defect-tolerant demultiplexer crossbar, and thus tolerance for defects which produce internal signal variation.

BRIEF DESCRIPTION OF THE DRAWINGS

FIG. 5 shows a number of vectors of Boolean values used in a discussion of vector operations and codes.

DETAILED DESCRIPTION OF THE INVENTION

The present invention is directed to fault-tolerant demultiplexer crossbars that use threshold-logic gates ("TL gates"), essentially tolerant multi-input AND gates. Using TL gates, rather than conventional AND gates, and configuring connections according to codeword configuration vectors allows a certain number of manufacturing defects within the demultiplexer crossbar to be tolerated, so that the demultiplexer crossbar operates according to design despite the manufacturing defects. The detailed discussion of the present invention is divided into six subsections: (1) an overview of demultiplexers; (2) an overview of logic and coding; (3) TL gates; (4) a TL-gate-implemented defect-tolerant demultiplexer that represents one embodiment of the present invention; (5) a metal-oxide-semiconductor("MOS")-logic implementation of a default-tolerant demultiplexer that represents one embodiment of the present invention; and (6) a resistor-logic implementation of a default-tolerant demultiplexer that represents one embodiment of the present invention.

Overview of Demultiplexers

Figure 1:
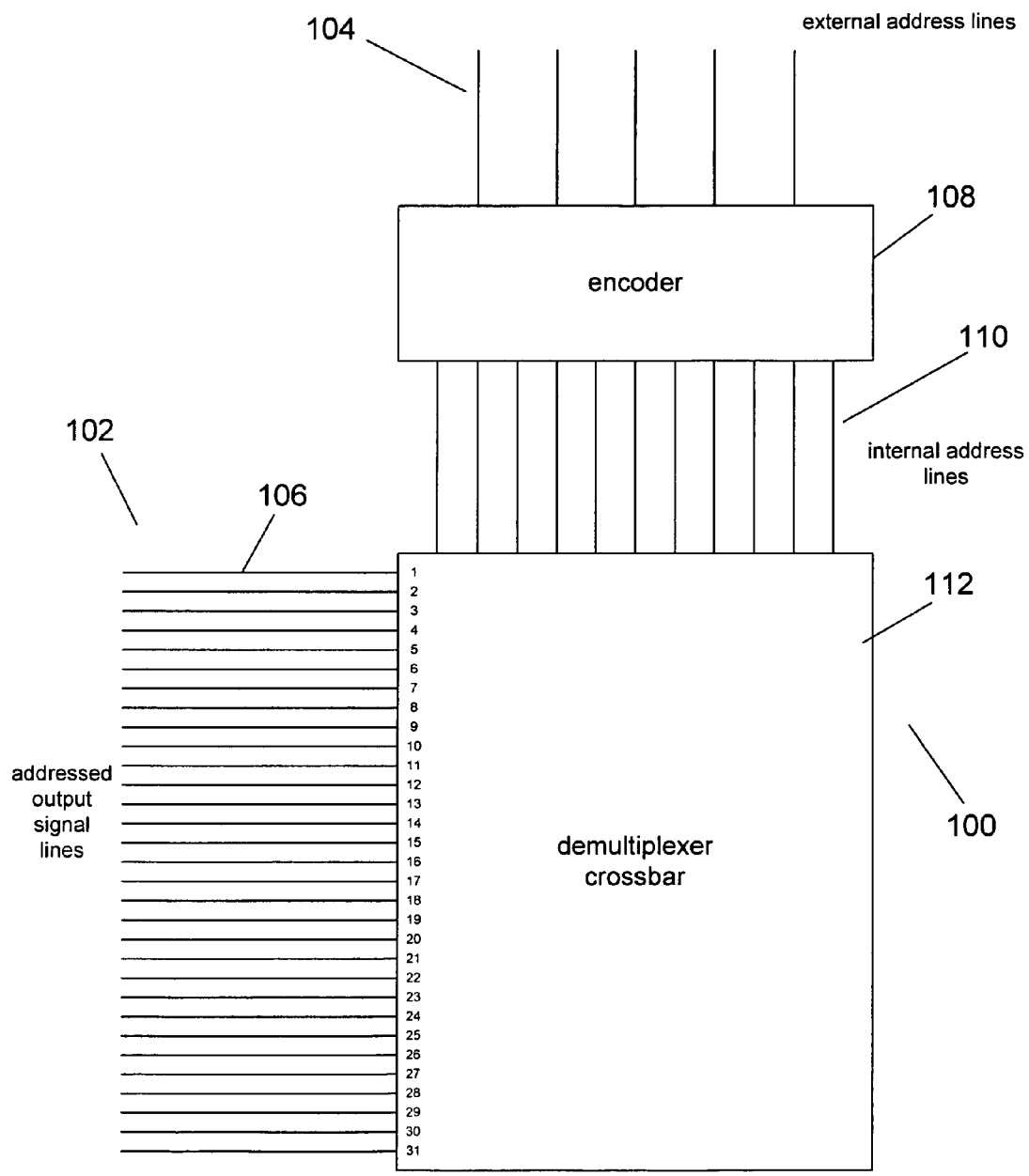
FIG. 1 shows a block-diagram-level representation of a demultiplexer.

FIG. 1 shows a block-diagram-level representation of a demultiplexer. The demultiplexer 100 is used to select specific output signal lines 102 based on addresses supplied to the external address lines 104. Commonly, each individual output signal line, such as output signal line 106, is assigned a unique address, and input of that unique address to the external address lines 104 causes the demultiplexer to assert the output signal line corresponding to the input address. In general, an asserted signal line has an electronic state that is detectably different from a non-asserted signal line. In digital circuits, it is common that a relatively high voltage state is referred to as representing Boolean value "1," and a relatively low voltage state is referred to as Boolean value "0." The convention can be reversed, and may involve high and low currents or other physical, measurable electronic states. Normally, only the asserted signal line has Boolean value "1," while the remaining unselected output signal lines have Boolean value "0." Demultiplexers can also operate as analog circuits.

A demultiplexer may provide for selection of multiple output signal lines by single input addresses. However, for the purposes of describing the present invention, it is assumed that there is a single external address assigned to each output signal line, and input of the external address corresponding to a particular output signal line causes the demultiplexer to select that particular output signal line by asserting that particular output signal line, while all other unaddressed and therefore unselected signal lines are not asserted. A demultiplexer generally includes an encoder 108 that receives external addresses input through external address lines 104 and that transforms the external addresses into internal addresses output by the encoder to internal address signal lines 110. It is often the case, and is the case in embodiments of the present invention described below, that the internal addresses are selected from codes, such as the codes used in error-correction coding, with specific properties that follow from systematic introduction of redundant information into codewords. The internal addresses are input via the internal address signal lines to a demultiplexer crossbar 112, which transforms an input internal address into assertion of the output signal line corresponding to that internal address, the internal address, in turn, corresponding to an external address received by the encoder.

Demultiplexers are used in a variety of different types of circuitry and electronic devices, including memory devices. For example, two-dimensional arrays of memory elements are often accessed using two demultiplexers, one demultiplexer for each dimension of the two-dimensional array. Demultiplexers may find increased utility in new generations of hybrid microscale-nanoscale devices, in which the external address lines and encoder are implemented in microscale or sub-microscale electronics while the demultiplexer crossbar is implemented in hybrid microscale-nanoscale electronics in order to address nanoscale output signal lines. Demultiplexers thus provide a useful interface between microscale electronics and nanoscale electronics.

Figure 2:
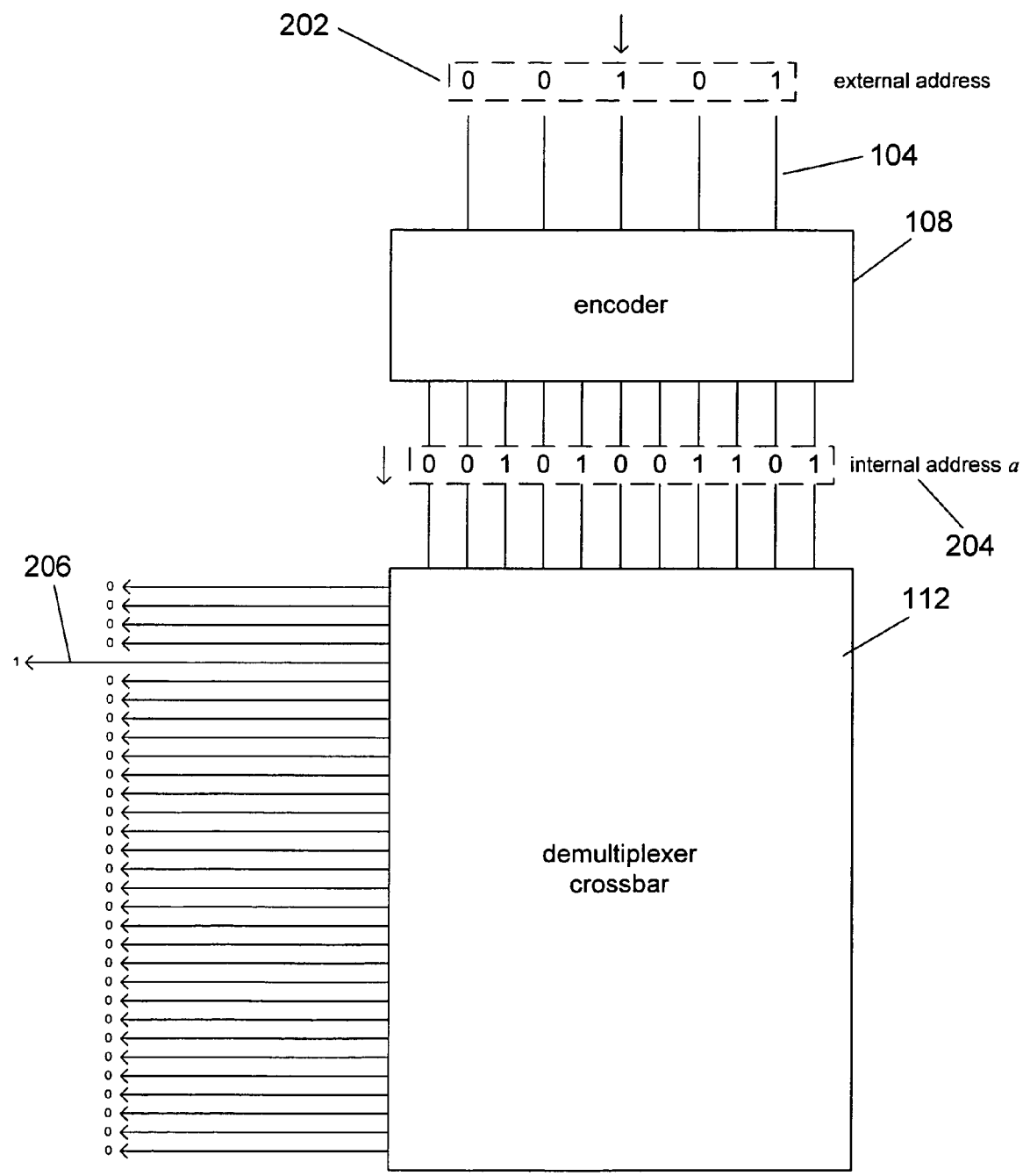
FIG. 2 illustrates operation of the demultiplexer shown in FIG. 1.

FIG. 2 illustrates operation of the demultiplexer shown in FIG. 1. In FIG. 2, an external address 202 is input through the external address lines 104 to the encoder 108. Note that the external address is a vector of Boolean values or, in other words, an n-bit Boolean address. In the exemplary demultiplexer shown in FIGS. 1 and 2, n=5. The encoder 108 transforms the input external address "00101" into an 11-bit internal address "00101001101" 204. In the exemplary demultiplexers shown in FIGS. 1 and 2, the encoder employs a systematic linear block code to encode the input external addresses. The encoder transforms a five-bit external address into an 11-bit internal address, in which the initial five bits are identical to those of the external address. The additional internal address signal lines corresponding to the remaining bits of the internal address represent redundant information that can be used to ensure that the demultiplexer operates correctly in the presence of various internal manufacturing defects and transient defects, in a fashion similar to encoding of a bit stream to ensure that the encoded bit stream, transmitted through a noisy channel, can be reconstructed by the receiver into the originally transmitted bit stream despite noise-introduced transmission errors. The demultiplexer crossbar 112 selects, or asserts, the single output signal line 206 corresponding to both the external address 202 and the internal address 204. All other output signal lines have Boolean value "0." while the addressed, asserted signal line 206 has Boolean value "1."

Figure 3:
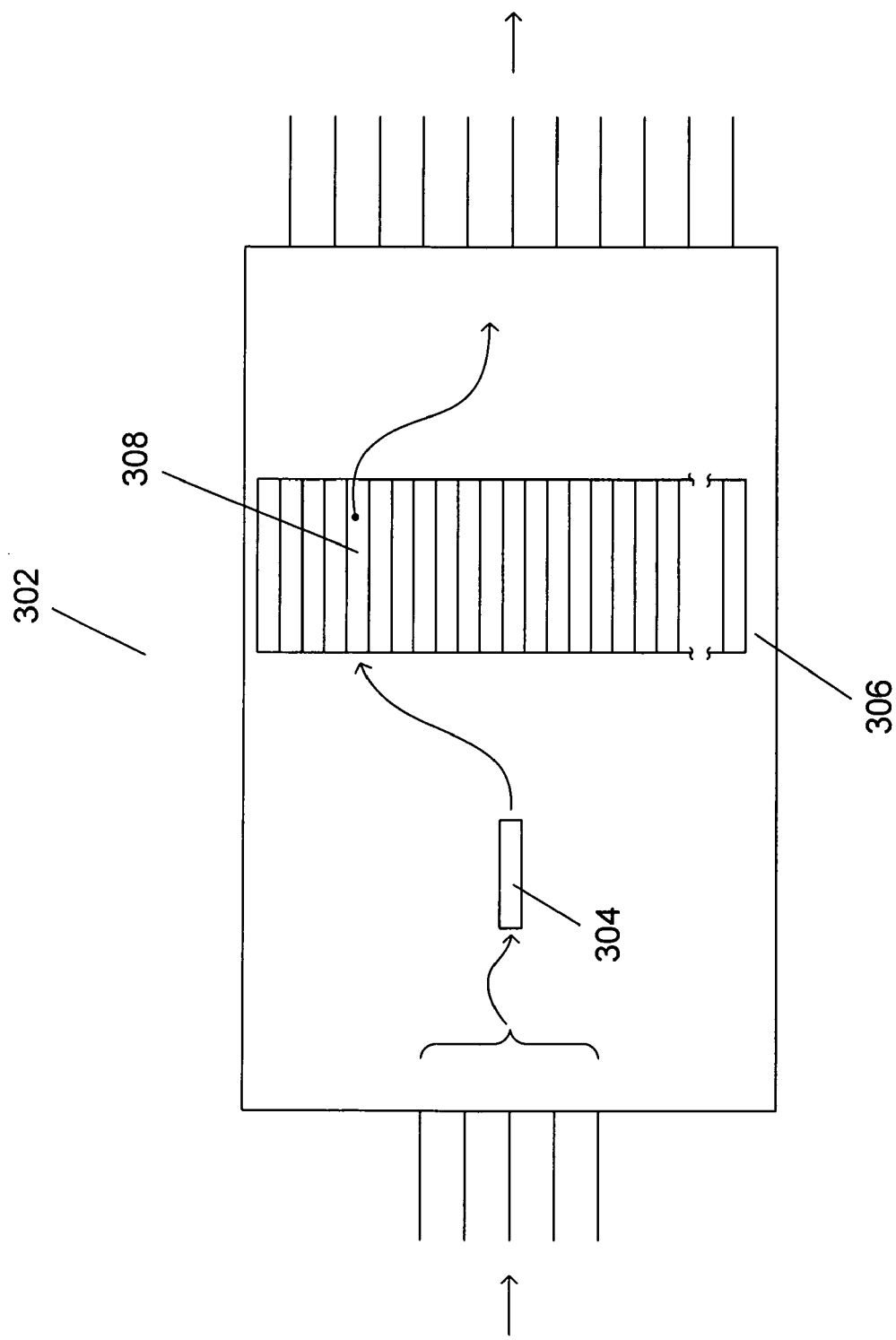
FIG. 3 illustrates one method for implementing an encoder.

There are many ways to implement the encoder component of a demultiplexer. FIG. 3 illustrates one method for implementing an encoder. Within the encoder 302, the input external address 304 is used as an index into a table 306 of internal addresses. A particular input external address 304 indexes, or selects, a particular internal address from the table of internal addresses 306, and that selected particular internal address 308 is output by the encoder. Table-driven encoders may provide useful flexibility for demultiplexer designers and manufacturers. In one example, in certain cases, the internal addresses loaded into the table of the encoder may be selected in order to circumvent or mask certain types of manufacturing defects within the demultiplexer crossbar detected after manufacture, but before deployment. In another example, the mapping between external addresses and output signal lines, and therefore the function of a device including the demultiplexer, may be altered following manufacture by loading a different set of internal addresses into the internal address table 306 within a table-driven encoder. Thus, device operation can be altered by a memory operation, rather than requiring manufacture of new demultiplexer components. There are many alternative possible implementations of the encoder portion of a demultiplexer, including processor-based encoders that generate internal addresses as codewords selected from a systematic linear block code by matrix multiplication of the bit vectors corresponding to input external addresses.

The embodiments of the present invention are generally directed to the demultiplexer-crossbar component of a demultiplexer. Thus, in the following discussion, the terms "address" and "addresses" refer to the internal addresses (204 in FIG. 2) rather than to the external addresses (202 in FIG. 2) input to the encoder component of a demultiplexer. The subsequently discussed embodiments of the present invention are thus directed to translation of an address input to a demultiplexer crossbar into selection, or assertion, of a particular output signal line corresponding to the input address.

Overview of Logic and Coding

As discussed in the preceding subsection, the fault-tolerant demultiplexer embodiments of the present invention concern translation of addresses, specified as vectors of Boolean values, into assertion, or selection, of an output signal line having an address, specified as a vector of Boolean values, equal to the input address. In many cases, due to the manner in which a demultiplexer crossbar is implemented, a particular output signal line with an assigned address h may be selected by a number of different, related internally observed addresses related to the assigned address h. The internally observed addresses, as discussed below, are the possible effective input addresses that result from certain defects and transient errors in the demultiplexer crossbar. In other words, the demultiplexer crossbar exhibits tolerance to certain types of defects and transient errors that may occur in manufacture or during operation of a demultiplexer crossbar by correctly selecting the output signal line with an assigned address h despite transformation of the input address h into an internally observed address h' different from, but related to, input address h.

Figure 4:
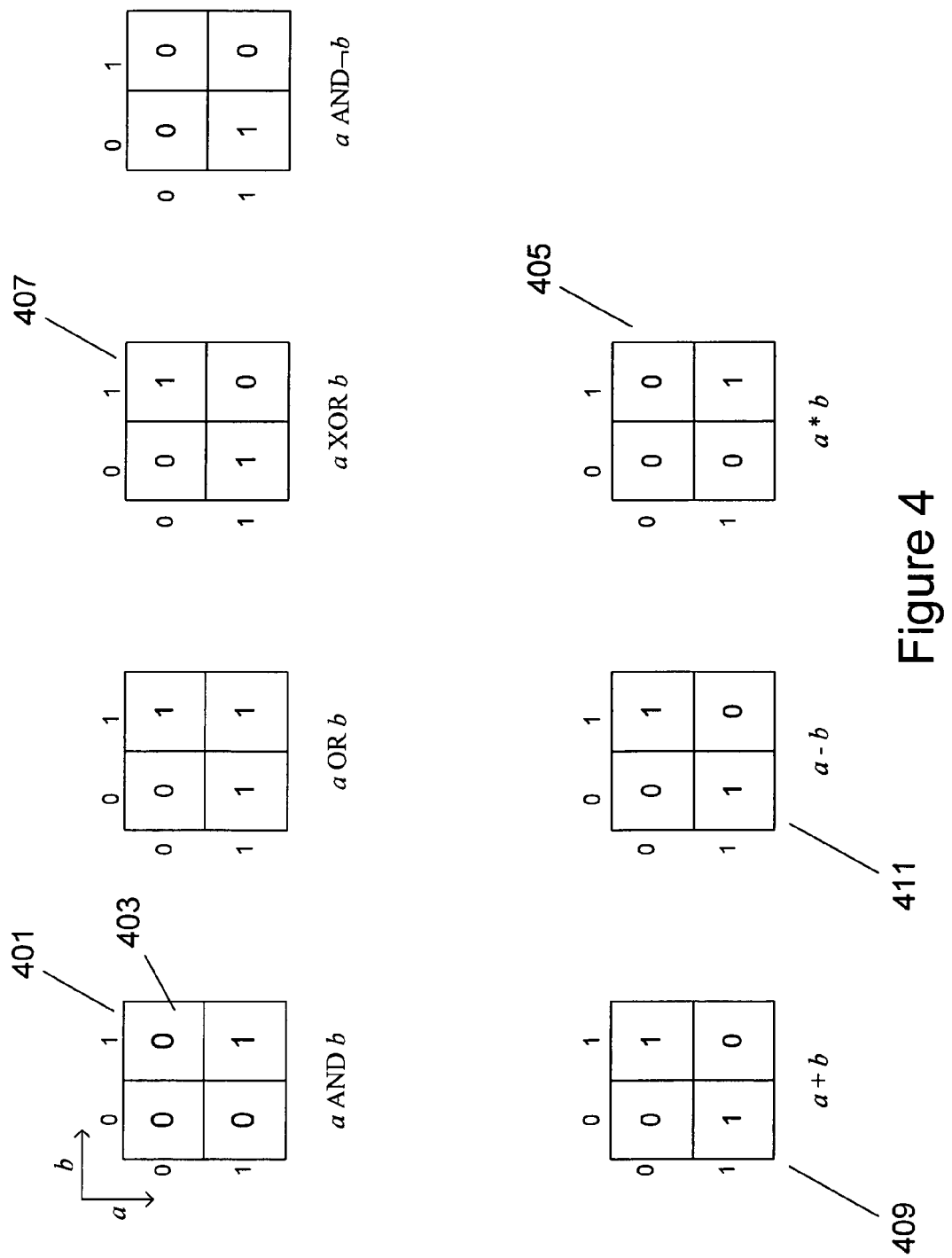
FIG. 4 provides a table of Boolean logic and Boolean arithmetic operations.

In order to discuss the present invention, certain conventions and properties of vectors of Boolean values, referred to below as "Boolean vectors," and of codewords comprising Boolean vectors are next discussed. FIG. 4 provides a table of Boolean logic and Boolean arithmetic operations. Each table, such as table 401 in FIG. 4, shows the results of a Boolean logic or Boolean arithmetic operation for all possible values of the two Boolean operands a and b. Thus, for example, referring to table 401 in FIG. 4, the result of the logic operation a AND b, when a="0" and b="1," is "0," as shown in cell 403 of table 401. The logic operation AND is identical to the arithmetic multiply operation, as shown in table 405, and the logic operation XOR, shown in table 407, is identical to the arithmetic operations addition, shown in table 409, and subtraction, shown in table 411. While the tables shown in FIG. 4 represent the logic and arithmetic operations for individual Boolean values a and b, Boolean vectors a and b can be considered to be arguments to vector versions of the same logic and arithmetic operations by carrying out the illustrated logic and operations for individual Boolean values on all pairs of corresponding Boolean values within the Boolean-vector operands a and b to produce a result vector.

FIG. 5 shows a number of Boolean vectors used in a discussion of vector operations and codes. A Boolean vector, such as Boolean vector 502, comprises an ordered set of n Boolean-values. Each Boolean value within a Boolean vector can be indexed by a position. Boolean vectors are often referred to by single-character or single-numeral names. For example, the Boolean vector 502 in FIG. 5 is referred to as "a," with the individual Boolean values within the Boolean vector referred to as "$a_0$," "$a_1$," . . . , "$a_7$." A vector of n Boolean values can also be referred to as an n-bit Boolean number (i.e. the n-bit Boolean number 504 corresponds to the Boolean vector 502, also referred to as "a," as shown in FIG. 5). The vector 1 506 is a special vector that includes only elements equal to the Boolean value "1," while the vector 0 508 is a special Boolean vector that includes only elements equal to the Boolean value "0."

The above discussion of vectors a, b, c, 1, f, and 0, shown in FIG. 5, can be summarized as:

$$a,b,c,1,f \in \{0,1\}^n \text{ where } n=8$$

The inner product between two Boolean vectors, such as the vectors b and c, is the sum of the pairwise products of the individual Boolean values within the vector:

$$\langle b, c \rangle = \sum_{i=0}^{n-1} b_i c_i = 2$$

The weight of a Boolean vector is the inner product of the Boolean vector with the special vector 1; it is also equal to the number of Boolean values within the vector having the Boolean value "1," expressed in functional notation as w( ):

$$w(b) = \langle b, 1 \rangle = 5$$

$$w(c) = \langle c, 1 \rangle = 4$$

When, for two vectors x and y, for each Boolean value in vector y with value "1," the corresponding Boolean value in vector x is also "1," x is said to "cover" y:

for vectors x and y, $$x \supseteq y \text{ when } \forall i, y_i = 1 \Rightarrow x_i = 1$$

Thus, for example, referring to vectors a, b, and c shown in FIG. 5:

$$a \supseteq b$$

$$\neg(a \supseteq c) \text{ because } c_6 = 1 \text{ while } a_6 = 0$$

$$\neg(b \supseteq a)$$

The complement of a Boolean vector $\bar{b}$ is a Boolean vector b with Boolean values that are the complements of the Boolean values in vector b:

$$\bar{b} = \overline{01011101} = 10100010 = \neg b$$

A code C can be thought of as a set of Boolean vectors:

$$C = \{a^0, a^1, a^2, \ldots, a^{M-1}\}, \text{ where } a^0, a^1, \ldots, a^{M-1} \in \{0, 1\}^n$$

Note that superscripts are used for the indices of the codewords, or Boolean vectors, within the set of Boolean vectors, or codewords, comprising the code. The superscripts are not meant to indicate powers, but are simply indices. Because there are m codewords in code C:

$$|C| = M$$

A Sperner set is defined as:

$$\text{if } \forall i,j \in \{0,1,\ldots,M-1\} a^i \supseteq a^j \Rightarrow i=j, \text{ then } C = \text{Sperner set}$$

In other words, no code word within a Sperner set covers any other code word within the Sperner set. Referring to the vector shown in FIG. 5 as examples:

$$D = \{b, c\} \text{ is a Sperner set}$$

$$E = \{a, b, c\} \text{ is not a Sperner, since } a \supseteq b$$

There are many different types of codes. For purposes of describing the current invention, only a few parameters are needed to describe sets of Boolean vectors, such as set C described above, that represent codes comprising sets of codewords. First, the unisymmetric distance between two codewords, or Boolean vectors, is defined as:

$$d_u(c,b) = \min\{\langle c, \bar{b} \rangle, \langle \bar{c}, b \rangle\}$$

The Hamming distance between two vectors c and b is defined as:

$$d(c,b) = \langle c, \bar{b} \rangle + \langle \bar{c}, b \rangle$$

Thus, the Hamming distance is the number of positions within two Boolean vectors at which the Boolean values at the positions differ between the two Boolean vectors. The unisymmetric distance $d_u$ is generally smaller, and always smaller than or equal to, the Hamming distance.

For a unisymmetric code C, the unisymmetric distance $d_u(C)$ is defined as:

$$d_u(C) = \min_{a^i, a^j \in C, i \neq j} d_u(a^i, a^j)$$

A parametric characterization of a unisymmetric code is:

$$C = (n, M, d_u) \text{ is a unisymmetric code}$$

where n is the length of the codewords;
M is the number of codewords in the code; and
$d_u$ is the unisymmetric distance for the code.

Note that a unisymmetric code D with N codewords, where N<M, can be generated from the unisymmetric code C=(n, M, $d_u$) by selecting N codewords from C. The Hamming distance of a code, d(C) is defined as:

$$d(C) = \min_{a^i, a^j \in C, i \neq j} d(a^i, a^j)$$

A constant weight code C is a code in which all of the codewords have one, identical weight:

$$C = \{a^0, a^1, a^2, \ldots, a^{M-1}\}$$

where, $\forall a^i \in C, w(a^i) = w$ and can be parametrically represented as:

$$C = (n, M, d, w)$$

where n is the length of the codewords;
M is the number of codewords in the code;
d is the Hamming distance for the code; and
w is the weight of each codeword.

A constant weight code C=(n,M,d,w) has unisymmetric distance $$\frac{d}{2}.$$

Using the vectors shown in FIG. 5, examples of the unisymmetric distance and Hamming distance between two vectors include:

$$d_u(a,f) = \min\{\langle a,\bar{f}\rangle, \langle \bar{a},f\rangle\} = 2$$

$$d(a,f) = \langle a,\bar{f}\rangle + \langle \bar{a},f\rangle = 4$$

TL Gates

Figure 6:
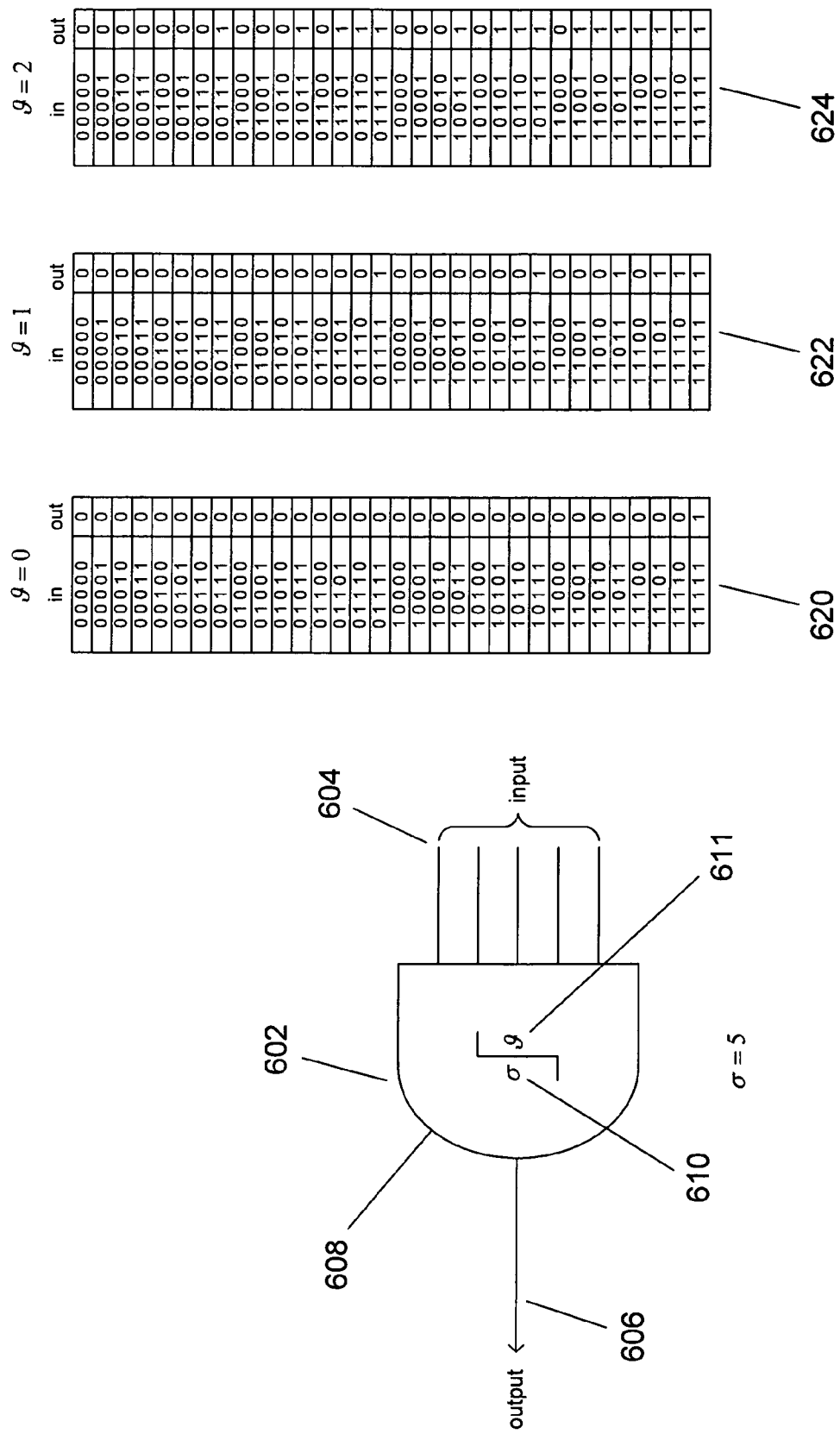
FIG. 6 illustrates a threshold-logic gate.

A threshold-logic gate ("TL gate") is, in essence, a "0"-input-tolerant logical AND gate. In other words, whereas a logical AND gate requires that, in order to output Boolean value "1," all of its inputs carry Boolean value "1," a TL gate requires that at least σ−θ input signals carry Boolean value "1" in order to output Boolean value "1," where σ is the number of input signals to the TL gate and θ is the threshold for the TL gate, or, in other words, the maximum number of "0"-valued input signals for which the TL gate nonetheless outputs Boolean value "1." FIG. 6 illustrates a threshold-logic gate. The TL gate symbol 602 is similar to a multi-input logical AND symbol, having three or more input signal lines 604 and a single output signal line 606. The interior symbol 608 represents a threshold, and the values of σ and θ 610 and 611 are specified on either side of the threshold symbol. The TL-gate symbol 602 shown in FIG. 6 represents a five-input TL gate with threshold θ.

Tables 620, 622, and 624 illustrate the input values and corresponding output values for three different TL gates having σ=5 inputs. The first table 620 characterizes operation of a TL gate with σ=5 and θ=0. This is equivalent to a five-input logical AND gate, since θ=0 means that the TL gate outputs Boolean value "1" only when all input signals have Boolean value "1." Table 622 characterizes operation of a TL gate with σ=5 and θ=1. Note that, by comparison to table 620, a larger number of different input values result in output of Boolean value "1." Table 624 characterizes operation of a TL gate with σ=5 and θ=2. A TL gate can be considered a tolerant logical AND gate in that the TL gate operates in a fashion similar to a logical AND gate, except that the TL gate outputs Boolean value "1" even when up to a threshold number of inputs have Boolean value "0."

Figure 7:
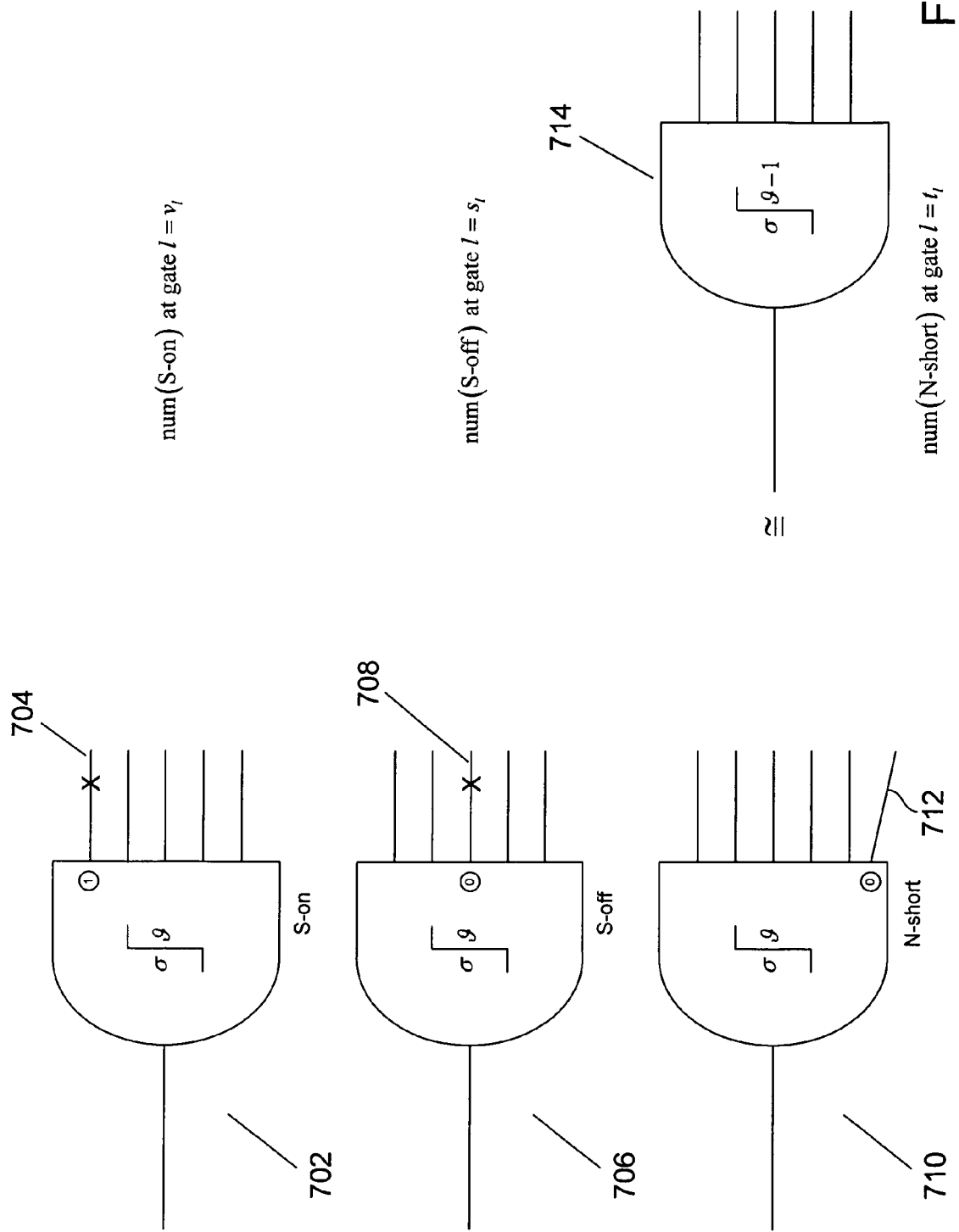
FIG. 7 shows a number of types of defects that can be associated with a threshold-logic gate.

FIG. 7 shows a number of types of defects that can be associated with a threshold-logic gate. TL gates, and the defects shown in FIG. 7, can be employed as abstractions that represent demultiplexer-crossbar circuitry of fault-tolerant embodiments of the present invention as well as various types of manufacturing defects that may occur within the demultiplexer crossbar. A first type of defect, referred to as an "S-on" defect 702, is equivalent to an input signal line 704 of a TL gate being stuck on, or, in other words, permanently asserted. Such defects can arise from various different types of manufacturing defects. In the following discussion, the number of S-on defects for a particular TL gate l is referred symbolically to as "$r_l$." A second type of defect 706, referred to as an "S-off" defect," is equivalent to a particular input signal line 708 of a TL gate being permanently de-asserted and therefore always having the Boolean value "0." The number of S-off defects at gate l is referred to as "$s_l$." A third type of defect 710 is equivalent to an additional input signal line added to a TL gate, with the additional input signal line being permanently de-asserted 712. These types of defects are referred to as "N-short" defects, and the number of such defects associated with a TL gate l is referred to as "$t_l$." A TL gate with $t_l$ N-short defects is equivalent to a TL gate with a lowered threshold 714 of θ-$t_l$. If, for example, a TL gate with σ=10 and θ=3 has two N-short defects, $t_l$=2, then the TL gate is equivalent to a TL gate without N-short defects and with σ=10 and θ=1.

Figure 8:
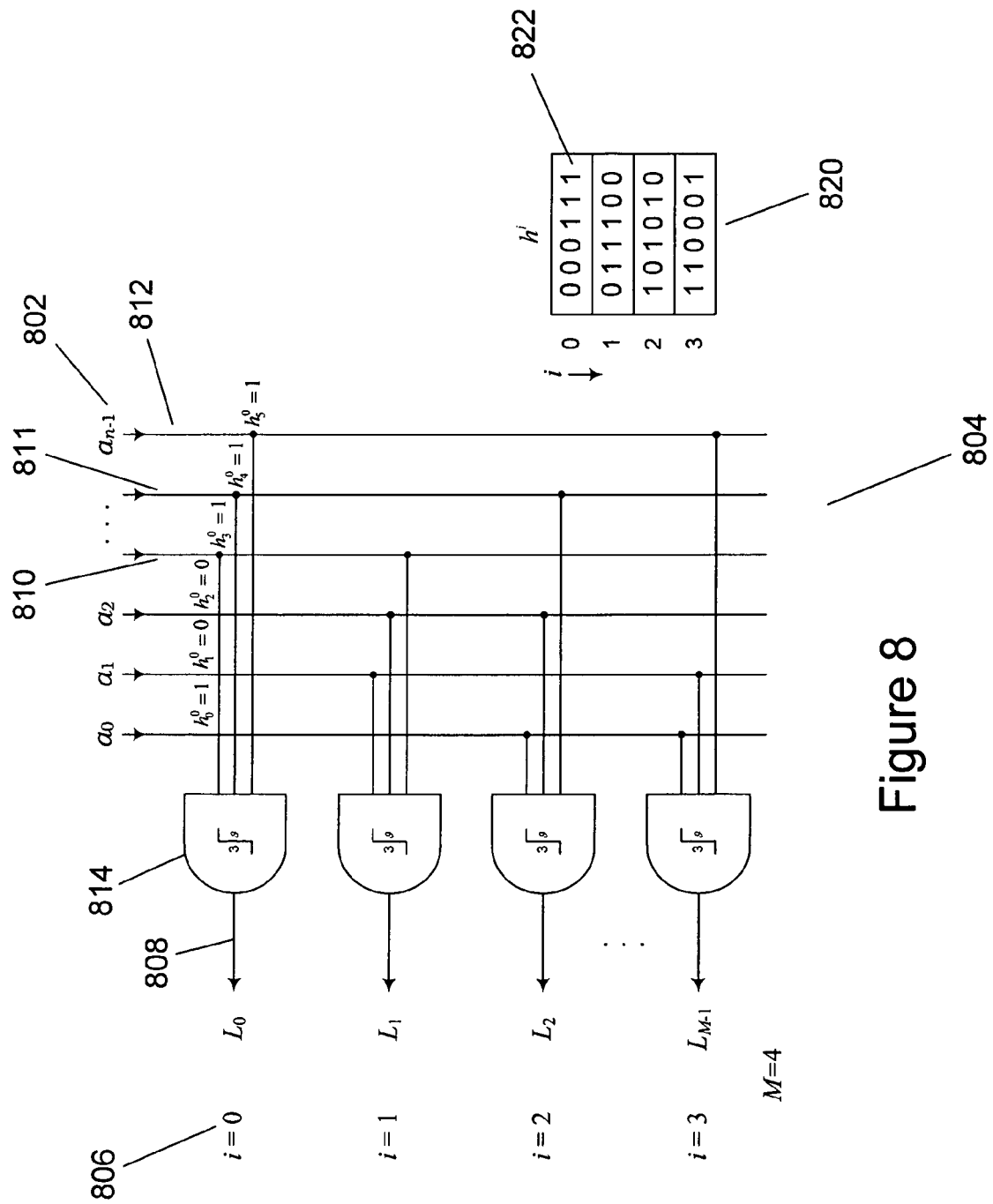
FIG. 8 shows an implementation of a demultiplexer crossbar based on threshold-logic gates.

TL-Gate-Implemented Defect-Tolerant Multiplexer that Represents One Embodiment of the Present Invention FIG. 8 shows an implementation of a demultiplexer crossbar based on threshold-logic gates. An n-bit address a 802 is input to the demultiplexer crossbar 804 in order to select for assertion of one of four output signal lines 806 $L_0, L_1, L_2,$ and $L_{M-1}$. Each output line is interconnected with three input signal lines via a TL gate with σ=3. For example, output signal line $L_0$ 808 is connected by TL gate 814 to input internal address signal lines 810, 811, and 812. Table 820 shows the correspondence between output signal lines $L_i$ and corresponding six-bit addresses for the output signal lines $h^i$. Thus, for example, output signal line $L_0$ 808 is associated with the address $h^0$, or 000111 822. As can be seen in FIG. 8, when address $h^0$, 000111, is input to the internal address signal lines, the bits within the address having Boolean value "1" correspond to those internal input address lines connected to the inputs of TL gate 814. When address 000111 is input to the internal address signal lines, all of the inputs to TL gate 814 have Boolean value "1," so that even when θ=0, address line $L_0$ is asserted. The addresses $h^i$ associated with the output lines $L_i$ can be thought of as configuration vectors, with each bit position within the vector $h^i$ corresponding to an internal address line, and those bit positions with Boolean value "1" indicating the internal address signal lines that are connected to inputs to the TL gate that outputs the output signal line $L_i$.

For the demultiplexer shown in FIG. 8 to properly work, when the address a=$h^l$ is input to the internal address signal lines, output signal line $L_l$ should be asserted, and all other output signal lines $L_{i \neq l}$ should be de-asserted. The demultiplexer should correctly function even in the presence of a certain number of defects of the type shown in FIG. 7.

When there are no defects, the inner product of the configuration vector $h^l$ and the address $a^i = h^l$ should equal the weight of configuration vector $h^l$ which should, in turn, equal $\sigma^l$ for the TL gate l that outputs output line $L_l$, or:

$$\langle h^l, a^i \rangle = w(h^l) = \sigma^l$$

The output signal line $L_l$ will be asserted when, for any input address $a^i$, the inner product of the configuration vector $h^l$ and the address $a^i$ is greater than or equal to $\sigma^l - \theta^l$ for the TL gate that interconnects output signal line $L_l$ with the internal address signal lines. Using the above-discussed conventions:

$L_l$ will be "1" when $\langle h^l, a \rangle \geq \sigma^l - \theta^l$ $\langle h^l, a^i \rangle \geq w(h^l) - \theta^l$ $\langle h^l, a \rangle \geq \langle h^l, 1 \rangle - \theta^l$ $\langle h^l, a^i \rangle - \langle h^l, 1 \rangle \geq -\theta^l$ $\langle h^l, a^i - 1 \rangle \geq -\theta^l$ $\langle h^l, 1 - a \rangle \leq \theta^l$ $\langle h^l, \bar{a} \rangle \leq \theta$ Similarly, the output signal line $L_l$ will be de-asserted when:

$\langle h^l, \bar{a}^i \rangle > \theta^l$

Thus, the inner product $\langle h^l, a^i \rangle$ is equal to the number of configured junctions within the demultiplexer crossbar for output signal line $L_l$ with corresponding bits in the address $a^i$ having Boolean value "1." The inner product $\langle h^l, \bar{a}^i \rangle$ is equal to the number of configured junctions within the demultiplexer crossbar for output signal line $L_l$ with corresponding bits in the address $a^i$ having Boolean value "0." If $C = \{h^0, h^1, \ldots, h^{M-1}\}$ is a unisymmetric code with $d_u(C) > \theta$, then, when each $h^i \in C$ is used as an input address, the corresponding output line $L_l$ will be uniquely selected. This applies regardless of fan-in at each gate, and assumes $\sigma = \text{fan-in} > \theta$ at each gate:

$\langle h^l, \bar{a} \rangle = 0 \leq \theta$ $\langle h^l, \bar{a}^{i^*} \rangle \geq d_u(C) < \theta$ Were no defects to arise during and after manufacture, logical AND gates, rather than TL gates, could be used in conventional fashion to produce demultiplexer crossbars. However, when defects do arise, such demultiplexer crossbars are prone to incorrect operation. Using TL gates, or implementations that can be modeled as TL gates, a demultiplexer crossbar can be designed to tolerate a certain number of various types of errors.

Figure 9:
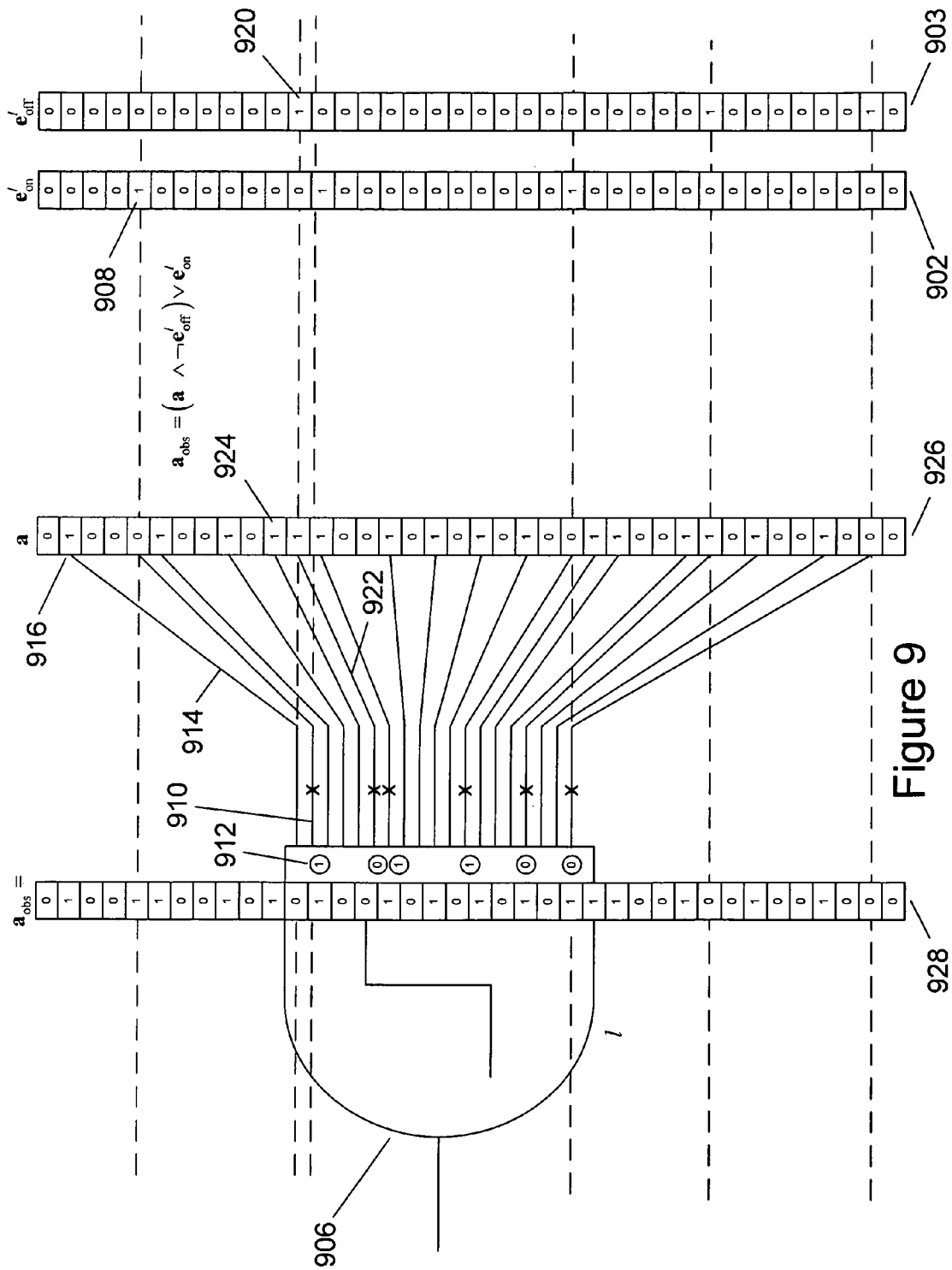
FIG. 9 illustrates the effect of the various types of errors illustrated in FIG. 7 on a threshold-logic gate.

FIG. 9 illustrates the effect of the various types of errors illustrated in FIG. 7 on a threshold-logic gate. As discussed above, N-short errors effectively lower the threshold $\theta$ of a TL gate. Thus, a TL gate l with $t_l$ N-short errors has an effective threshold of $\theta - t_l$. The S-on and S-off defects associated with TL gate l 906 can be represented by two Boolean error vectors $e_{on}^l$ and $e_{off}^l$ 902 and 903. At every bit position in the vector $e_{on}^l$ 902 where Boolean value "1" occurs, the input signal line to TL gate l connected to the internal address signal line represented by the bit position has an S-on defect. For example, in FIG. 9, Boolean value "1" 908 at the fifth position within the vector $e_{on}^l$ indicates that the input signal line of TL gate l 910 connected to the fifth internal address line has an S-on defect, shown in FIG. 9 by the Boolean value "1" within a circle 912 associated with input signal line 910. Note that only a portion of the bits within an input address 26 are associated with configured demultiplexer crossbar junctions that interconnect internal address signal lines with an input line to a TL gate. In FIG. 9, for example, the first input signal line 914 for TL gate l 906 is interconnected with the second internal address line through a configured junction that is, in turn, associated with the second bit 916 of each address a 926 input to the internal address signal lines. The vector $e_{off}^l$ 903 has Boolean value "1" in each position corresponding to internal address line interconnected with an input signal line to the TL gate l that suffers an S-off defect. For example, Boolean value "1" 920 in vector $e_{off}^l$ 903 indicates that input signal line 922 interconnected with the internal address line corresponding to internal-address bit 924 suffers an S-off defect. For any address a input to the demultiplexer crossbar that includes TL gate l 906, the S-on and S-off defects encoded in vectors $e_{on}^l$ 902 and $e_{off}^l$ 903 have the effect of transforming the input address a into an observed input address $a_{obs}$ 928. The observed input address $a_{obs}$ can be computed as:

$$a_{obs} = (a \wedge \bar{e}_{off}^l) \vee e_{on}^l$$

A fault-tolerant demultiplexer crossbar is designed to operate correctly even when certain types and numbers of defects occur. Given that the configuration vectors, or addresses, for the output signal lines of the demultiplexer crossbar are codewords of a code C:

$$C = \{h^0, h^1, \ldots, h^{M-1}\}$$

then, for all of the output signal lines $L_i$ and associated TL gates i:

when, $\forall_i \in \{0, 1, \ldots, M-1\}, s_i + t_i \leq \theta_i$ AND $r_i - t_i < d_u(C) - \theta_i$ then, $\forall_i$ input address $a^i = h^i$ uniquely selects output line $L_i$ In other words, when the sum of the S-off and N-short errors at each gate i is less than the threshold $\theta_i$ for gate i, and when the difference between the number of S-on and N-short errors at each gate i is less than the difference between the unisymmetric distance of the code C and the threshold of gate i, then the demultiplexer crossbar properly operates, and selects uniquely each output signal line $L_i$ when the address $a^i = h^i$ is input to the internal address signal lines of the demultiplexer crossbar.

This result can be proved as follows. First, the definitions of the terms $r_i$, $s_i$, and $t_i$ are again provided:

number(S-on) at gate $i = r_i$ number(S-off) at gate $i = s_i$ number(N-short) at gate $i = t_i$ Then, the observed address at gate l when address $a^i$ is input to the internal signal lines of the demultiplexer crossbar, $a_{obs\ at\ l}^{i,l} a^{i,l}$ is computed, as discussed with reference to FIG. 9, as:

$$a_{obs\ at\ l}^{i,l} = (a^i \wedge \bar{e}_{off}^l) \vee e_{on}^l$$

where $e_{off}^l$ and $e_{on}^l$ are the error vectors for gate l indicating the S-off and S-on defective input signal lines, as discussed with reference to FIG. 9.

Because any particular input signal line can be S-on or S-off defective, but not both S-on and S-off defective:

$$e_{off}^l \wedge e_{on}^l = 0$$

Then, by conventional Boolean algebra:

$$\bar{e}_{off}^l \vee e_{on}^l = 1$$

$$e_{off}^l \wedge (\bar{e}_{off}^l \vee e_{on}^l) = 1 \wedge e_{off}^l$$

$$(e_{off}^l \wedge \bar{e}_{off}^l) \vee (e_{off}^l \wedge e_{on}^l) = e_{off}^l$$

$$0 \vee (e_{off}^l \wedge e_{on}^l) = e_{off}^l$$

$$e_{off}^l \wedge e_{on}^l = e_{off}^l$$

S-on and S-off defects can only occur for configured junctions, so that:

$$h^l \wedge e_{off}^l = e_{off}^l$$

$$h^l \wedge e_{on}^l = e_{on}^l$$

The condition for the input address $a^l$ to select the output signal line $L_l$ is:

$$\langle h^l, \overline{a}_{obs\,at\,l}^l \rangle \leq \theta - t_l$$

This is equivalent to the statement:

$$w(h^l \wedge \overline{a}_{obs\,at\,l}^l) \leq \theta - t_l$$

By conventional Boolean algebra:

$$h' \wedge \overline{a}'_{obsatl} = h' \wedge \neg [(a' \wedge \overline{e}'_{off}) \vee e'_{on}]$$
$$= h' \wedge [\neg (a' \wedge \overline{e}'_{off}) \wedge \overline{e}'_{on}]$$
$$= [h' \wedge \neg (a' \wedge \overline{e}'_{off})] \wedge \overline{e}'_{on}$$
$$= [h' \wedge (\overline{a}' \vee e'_{off})] \wedge \overline{e}'_{on}$$
$$= (h' \wedge \overline{a}') \vee (h' \wedge e'_{off}) \wedge \overline{e}'_{on}$$
$$= 0 \vee (h' \wedge (e'_{off} \wedge \overline{e}'_{on}))$$
$$= e'_{off}$$

Therefore:

$$w(h^l \wedge \overline{a}_{obs\,at\,l}^l) = w(e_{off}^l) = s_l$$

$$s_l \leq \theta - t_l$$

$$s_l + t_l \leq \theta$$

The condition that none of the output signal lines $h^{i \neq l}$ can be selected when the address $a^l$ is input to the internal address signal lines can be expressed as:

$$\langle h^{i \neq l}, \overline{a}_{obs\,at\,l}^l \rangle > \theta - t_i$$

This is equivalent to:

$$w\langle h^i \wedge \overline{a}_{obs\,at\,l} \rangle > \theta - t_i$$

As in the previous proof of the first condition:

$$h^i \wedge \overline{a}_{obs\,at\,i}^l = [(h^i \wedge \overline{a}^l) \vee (h^i \wedge e_{off}^i)] \wedge \overline{e}_{on}^i$$

The logical OR operation $(h^i \wedge \overline{a}^l) \vee (h^i \wedge e_{off}^i)$ in the above equation produces a vector with weight $\geq d_u(C)$, since $w(h^i \wedge \overline{a}^l) \geq d_u(C)$, and the logical AND operation in the above equation has the effect of zeroing any Boolean "1" values in the result of the OR operation that are not set in the vector corresponding to the right-hand term in the above equation. The number of "0" elements in the vector $\overline{e}_{on}^i$ equals $r_i$. In other words:

$$d_u(C) - r_i > \theta - t_i$$

Therefore, a TL-gate-based demultiplexer crossbar properly operates when, for each output signal line $L_i$ and the associated TL gate i:

$$s_i + t_i \leq \theta_i$$

$$r_i - t_i < d_u(C) - \theta_i$$

Figure 10:
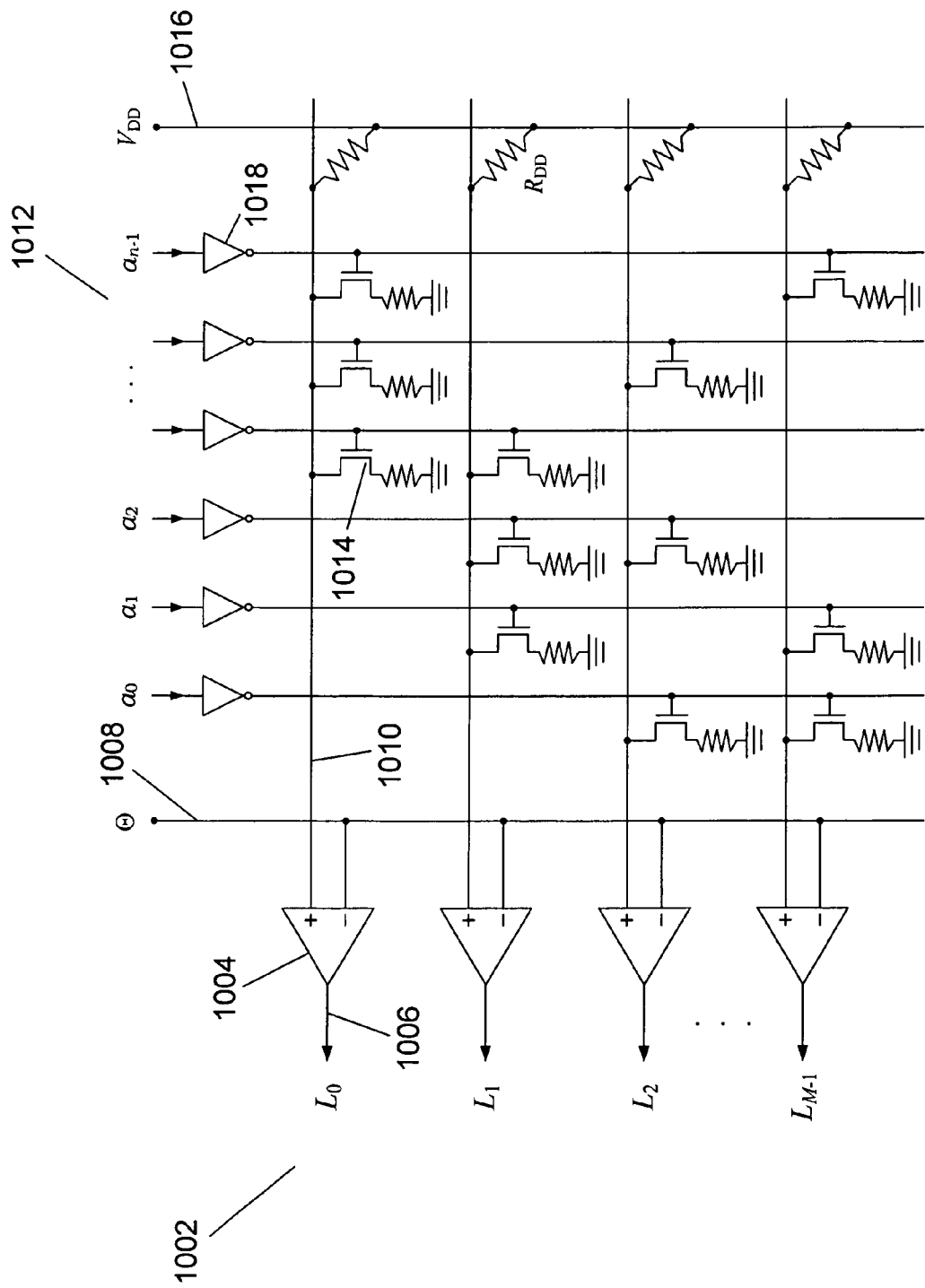
FIG. 10 shows a metal-oxide-semiconductor-logic implementation of a demultiplexer crossbar that represents one embodiment of the present invention.

MOS-Logic Implementation of a Defect-Tolerant Multiplexer that Represents One Embodiment of the Present Invention FIG. 10 shows a metal-oxide-semiconductor-logic implementation of a demultiplexer crossbar that represents one embodiment of the present invention. In FIG. 10, each output signal line $L_i$ 1002 is output from a comparator, such as comparator 1004 that outputs output signal line $L_O$ 1006. The comparator compares a voltage Θ 1008 to a voltage input on an internal signal line 1010 that is joined to a selected number of internal address signal lines 1012 by transistor-based configured connections, such as transistor-based configured connection 1014. A high voltage $V_{DD}$ is input via signal line 1016 to all of the internal signal lines that interconnect with internal address signal lines and that are input to the + terminals of the comparators. Consider comparator 1004, which outputs a value to output signal line $L_O$ 1006. If the signal input to the "+" terminal of the comparator by internal signal line 1010 is equal to, or greater than, the voltage Θ input to the "−" terminal of the comparator 1004, then the comparator outputs Boolean value "1." Otherwise, the comparator outputs Boolean value "0." Note that the internal address signal lines all pass through inverters, such as inverter 1018, prior to connection through transistor-based configured connections to the signal lines input to the + terminals of the comparators. Comparing FIG. 10 to FIG. 8 reveals that the transistor-based configured connections are placed exactly at those demultiplexer crossbar junctions at which TL-gate inputs connect to internal address signal lines in FIG. 8. In other words, FIG. 10 exactly implements the demultiplexer crossbar shown in FIG. 8, where the combination of comparators and transistor-based configured connections are equivalent to the TL gates in FIG. 8.

Figure 11:
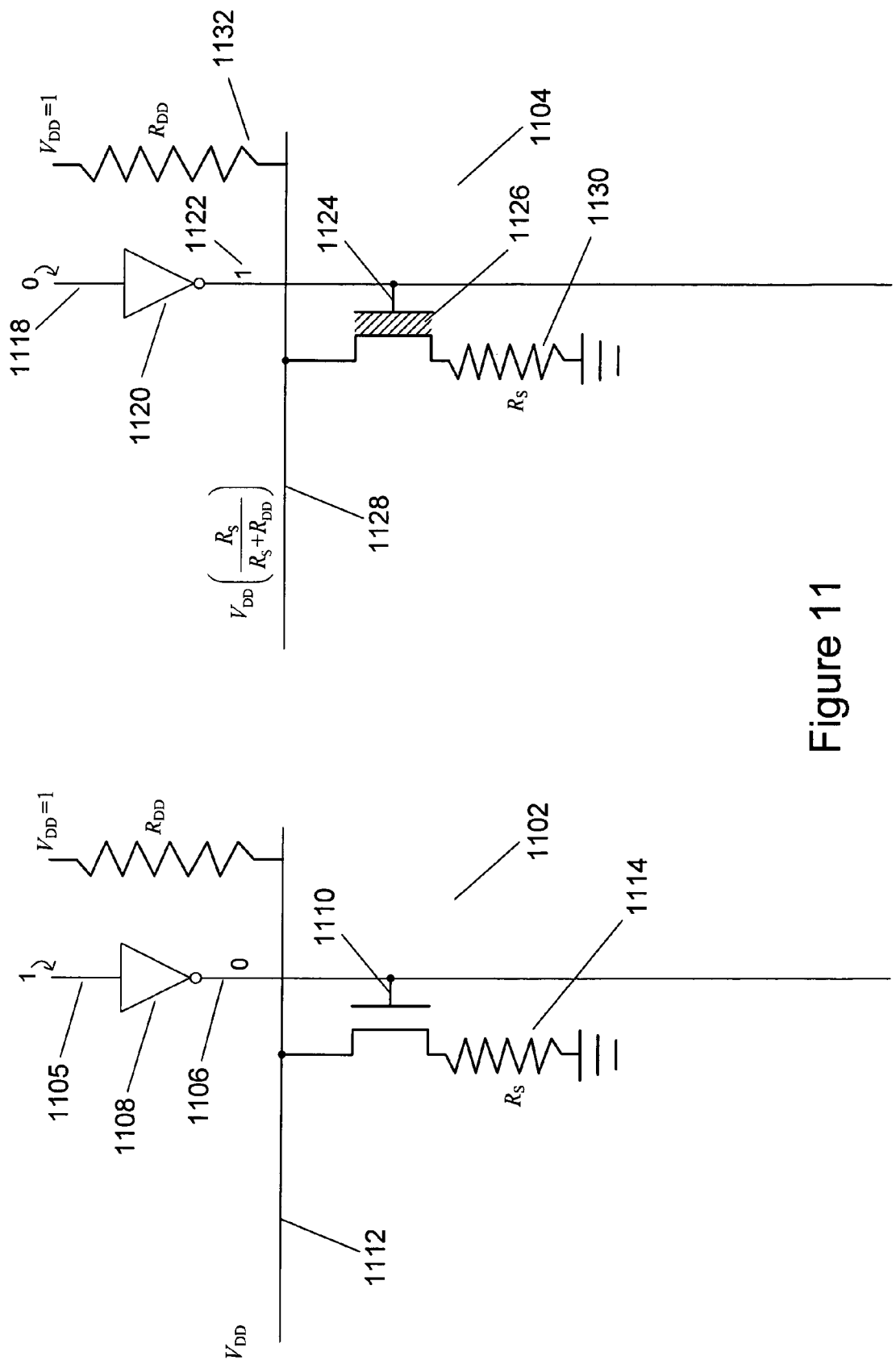
FIG. 11 illustrates operation of the transistor-based connections in the demultiplexer-crossbar implementation shown in FIG. 10.

FIG. 11 illustrates operation of the transistor-based configured connections in the demultiplexer-crossbar implementation shown in FIG. 10. The junction 1102 on the left-hand side of FIG. 11 indicates operation of the transistor-based junction upon input of Boolean value "1" to the associated internal address line, and transistor-based configured connection 1104 on the right side of FIG. 11 illustrates operation of the transistor-based configured connection when the Boolean value "0" is input to the associated internal address signal line. When the Boolean value "1" is input into the associated internal address line 1105, that value is inverted to Boolean value "0" 1106 by the inverter 1108. Thus, Boolean value "0" is input to the gate 1110 of the transistor. The transistor is therefore in an open state, and is not conductive. Signal line 1112 is not connected through resistor 1114 to ground, and therefore signal line 1112 is essentially at voltage $V_{DD}$ when no current is flowing. However, when Boolean value "0" is input to the internal address signal line 1118, the inverter 1120 outputs Boolean value "1" 1122 to the gate 1124 of the transistor. Assuming that that voltage value is sufficient to close the transistor, indicated by the cross-hatching 1126 within the transistor symbol, signal line 1128 is connected through the transistor and resistor 1130 to ground, essentially making signal line 1128 a tap into a voltage divider comprising resistors 1132 and 1130, so that the voltage on signal line 1128 is $$V_{DD}\left(\frac{R_S}{R_S + R_{DD}}\right).$$

Figure 12:
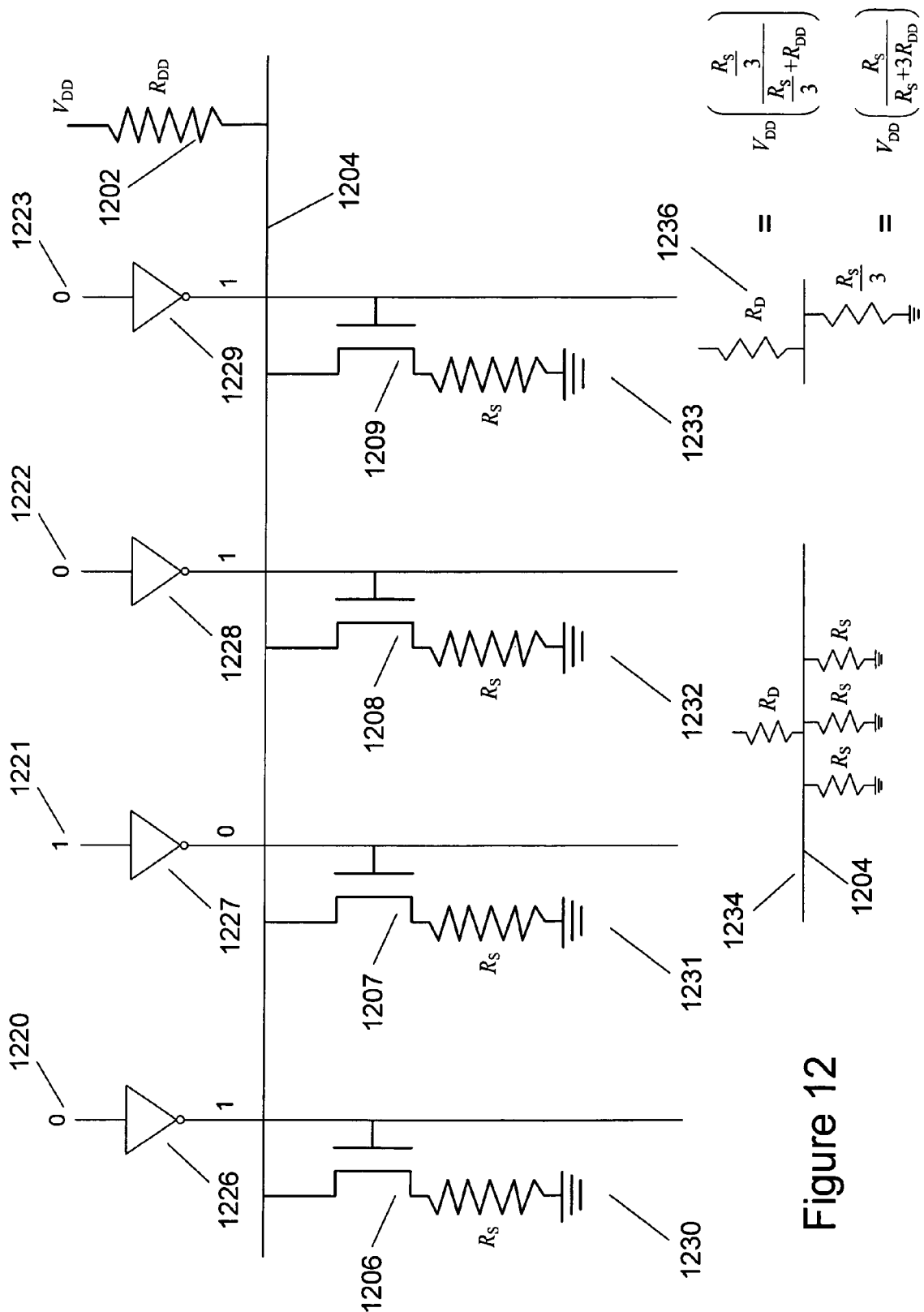
FIG. 12 shows a horizontal signal line within a crossbar demultiplexer, such as that shown in FIG. 10, with four transistor-based configuration connections.

FIG. 12 shows a horizontal signal line within a crossbar demultiplexer, such as that shown in FIG. 10, with four transistor-based configured connections. Again, the voltage $V_{DD}$ is input, through a resistor 1202 having resistance $R_{DD}$ to the horizontal signal line 1204. The horizontal signal line 1204 is, in turn, potentially connected through transistor-based configured connections 1206-1209 to four pull-down resistors 1230-1233, the transistor-based configured connections controlled by input signal lines 1220-1223 that pass through inverters 1226-1229 and are connected to the gate inputs of the transistors within the transistor-based configured connections 1206-1209. In FIG. 12, three Boolean value "0" and one Boolean value "1" inputs are input to the four internal address signal lines 1220-1223. The entire circuit forms a voltage divider symbolically represented as circuit 1234 in FIG. 12, with the horizontal signal line 1204 serving as the tap line of a voltage divider equivalent to circuit 1236. The voltage of the horizontal signal line 1204 is therefore $$V_{DD}\left(\frac{\frac{R_S}{3}}{\frac{R_S}{3} + R_{DD}}\right).$$

In general, when no address inputs have Boolean value "0," the horizontal signal line has voltage $V_{DD}$. When n of the figured internal address signal lines have Boolean value "0," voltage on the horizontal signal lines is $$V_{DD}\left(\frac{\frac{R_S}{n}}{\frac{R_S}{n} + R_{DD}}\right).$$

For the MOS-logic demultiplexer crossbar implementation shown in FIG. 10 to operate as if it were a TL-gate-based, equivalent demultiplexer crossbar shown in FIG. 8, the threshold voltage, or reference voltage, Θ needs to be set as:

$$V_{DD}\left(\frac{R_S}{R_S + (\vartheta+1)R_{DD}}\right) < \Theta \leq \left(\frac{R_S}{R_S + \vartheta R_{DD}}\right)V_{DD}$$

The corresponding threshold for the gates, θ, can be computed as:

$$\left(\frac{V_{DD}}{\Theta} - 1\right)\frac{R_S}{R_{DD}} \geq \vartheta > \left[\left(\frac{V_{DD}}{\Theta} - 1\right)\frac{R_S}{R_{DD}}\right] - 1$$

When an address a is input to the internal address signal lines, and when τ is the number of configured internal address signal lines with Boolean value "0" in address a as input, the voltage on the horizontal demultiplexer-crossbar signal line i is:

$$V_{DD}\frac{R_S}{R_S + \tau R_{DD}} = V(\tau)$$

The voltage V(τ) is the signal corresponding to the inner product:

$$\langle h^i, \bar{a} \rangle$$

Thus:

$$V(\tau) \geq \Theta \Rightarrow V_{DD}\frac{R_S}{R_S + \tau R_{DD}} \geq V_{DD}\frac{R_S}{R_S + \vartheta R_{DD}} \Rightarrow \tau \leq \vartheta$$

The voltage margin for the demultiplexer crossbar shown in FIG. 10 is the difference between the minimum voltage value at the "+" terminal of a comparator when the associated output signal line should be high and the maximum voltage at the "+" terminal of the comparator when the associated output signal line should be low. In other words, the voltage margin m is obtained by substituting t=0 in the following expression:

$$m = \text{voltage margin} = \frac{V_{DD}}{1 + X(\vartheta - t)} - \frac{V_{DD}}{1 + X(\vartheta + 1)}$$

where $X = \frac{R_{DD}}{R_S}$

It is desirable for the voltage margin to be as large as possible. The voltage margin can be increased by selecting a larger t (at the expense of limiting further the tolerated number of defects of type S-off and N-short), and then maximizing over the resistor values $$\frac{R_S}{R_{DD}}:$$

$$\frac{dm}{dX} = 0 \text{ gives } X \text{ when } m \text{ is maximum}$$

$$\frac{dm}{dX} = \frac{-V(\vartheta - t)}{(1 + X(\vartheta - t))^2} + \frac{V(\vartheta + 1)}{(1 + X(\vartheta + 1))^2} = 0$$

$$X = [(\vartheta - t)(\vartheta + 1)]^{-\frac{1}{2}}$$

$$\frac{R_S}{R_{DD}} = \sqrt{(\vartheta - t)(\vartheta + 1)}$$

Figure 13:
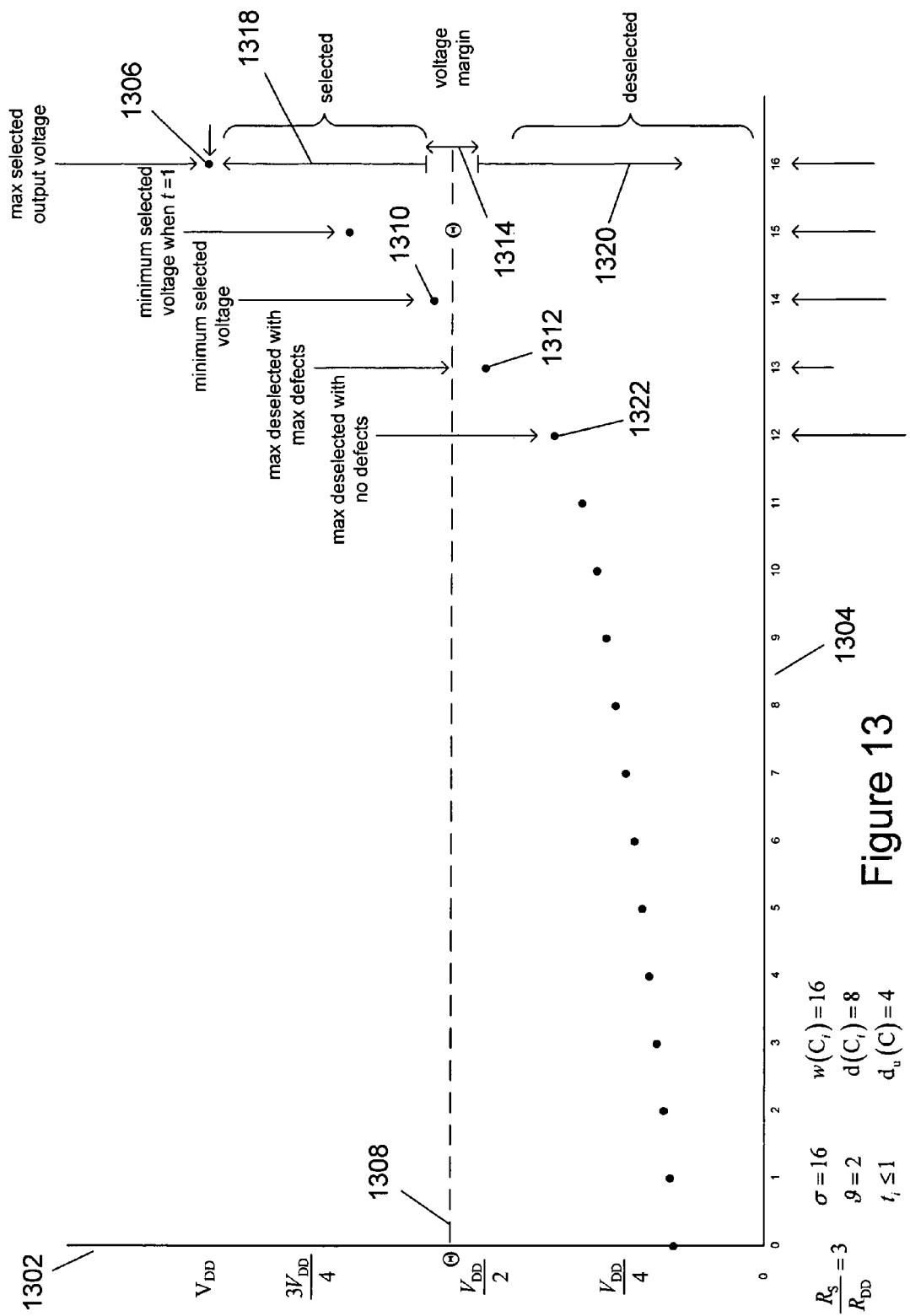
FIG. 13 illustrates voltage levels on the horizontal signal lines of a demultiplexer crossbar for various input addresses.

FIG. 13 illustrates voltage levels on the horizontal signal lines of a demultiplexer crossbar for various input addresses. In FIG. 13, the number of configured internal address signal lines, σ, is 16, and the input internal addresses are assumed to be selected from a constant weight code C with constant weight equal to 16, with the Hamming distance of a code equal to 8 and the unisymmetric distance for the code equal to 4. Using the above-computed resistor ratio for maximum voltage margin, the ratio $$\frac{R_S}{R_{DD}}$$

is for the example is equal to √3. The voltages on the horizontal demultiplexer-crossbar signal line are plotted with respect to the vertical axis 1302 in FIG. 3, and the number of configured junctions into which Boolean values "1" are input via the associated internal address signal lines is plotted with respect to the horizontal axis 1304. Thus, as discussed above, when the configuration vector $h^l$ is used as the address a for output signal line l, Boolean value "1" is input to all 16 configured junctions. When no defects are present, input of the configuration vector $h^l$ as the address a produces the voltage $V_{DD}$ on the horizontal demultiplexer-crossbar signal line, as represented by point 1306 in FIG. 13. The threshold voltage Θ 1308 is set so that the equivalent TL-gate threshold θ is 2. In other words, when only 14 of the 16 configured internal address signal lines have Boolean value "1" inputs, as represented by point 1310 in FIG. 13, the voltage on the horizontal demultiplexer-crossbar signal line is still somewhat above the reference voltage Θ, and thus the comparator associated with horizontal demultiplexer crossbar signal line has "+" terminal voltage greater than "−" terminal voltage, and thus outputs Boolean value "1." However, when only 13 of the configured 16 internal address signal lines have Boolean value "1," as represented by point 1312 in FIG. 13, then the voltage of the horizontal demultiplexer-crossbar signal line falls below the reference voltage Θ, and the comparator outputs Boolean value "0." The voltage margin 1314 thus spans voltage values between points 1312 and 1310. The voltage values from points 1310 up to point 1306 span the selected voltage range 1318 and the voltages below the voltage of point 1312, represented by vertical line 1320, represent the deselected voltages. Note that, because the configurations $h^i$ are selected from the above-described code, and because the unisymmetric distance between codewords $d_u(C)$ is four for this code, the maximum voltage for an input address other than the input address for the signal line is represented by point 1322 in FIG. 13, well below the reference voltage Θ. In other words, an input address for an output signal line other than the configuration vector for the output signal line can produce only up to 16−4=12 input Boolean values "1" at configured connections, and therefore results in a voltage on the horizontal demultiplexer-crossbar signal line below the threshold voltage, and therefore output of Boolean value "0" by the comparator.

According to the above-discussed defect-tolerance criteria, a demultiplexer with horizontal demultiplexer-crossbar signal lines configured as shown in FIG. 13 can tolerate up to two S-off defects (with no N-short defects), up to two N-short defects (with no S-off defects), and at most one S-on defect. Of course, the numbers and types of defects have to conform to the above-discussed defect-criteria equations for the demultiplexer to correctly operate. The equations can be verified, for the case shown in FIG. 13, by noting that two S-off defects, absent other defects, would essentially lower the voltage on the horizontal demultiplexer-crossbar signal line for an input address equal to the configuration vector for the signal line from voltage $V_{DD}$ corresponding to point 1306 to the voltage corresponding to point 1310. Thus, two S-off defects can be tolerated, in the absence of other defects. Similarly, an S-on defect would raise the voltage on the horizontal demultiplexer-crossbar signal line, when an address is input to the internal signal lines not equal to the configuration vector for the signal line, from the voltage corresponding to point 1322 to the voltage corresponding to point 1312, absent other defects. Here, only a single S-on type of defect can be tolerated before the voltage is raised above the reference voltage Θ.

Thus, the MOS-logic implementation of a demultiplexer crossbar, such as that shown in FIG. 10, is equivalent to a TL-gate implementation of the crossbar demultiplexer, as shown in FIG. 8. The above-derived constraints for correct operation despite S-on, S-off, and N-short defects apply to the MOS-logic implementation, where S-on defects correspond to stuck-open or missing transistors, S-off defects correspond to shorted transistors, and N-short defects correspond to non-configured junctions that are shorted through a resistance $R_S$ to ground. N-short defects can also correspond to a decrease in the effective threshold θ of the equivalent TL gate.

Figure 14:
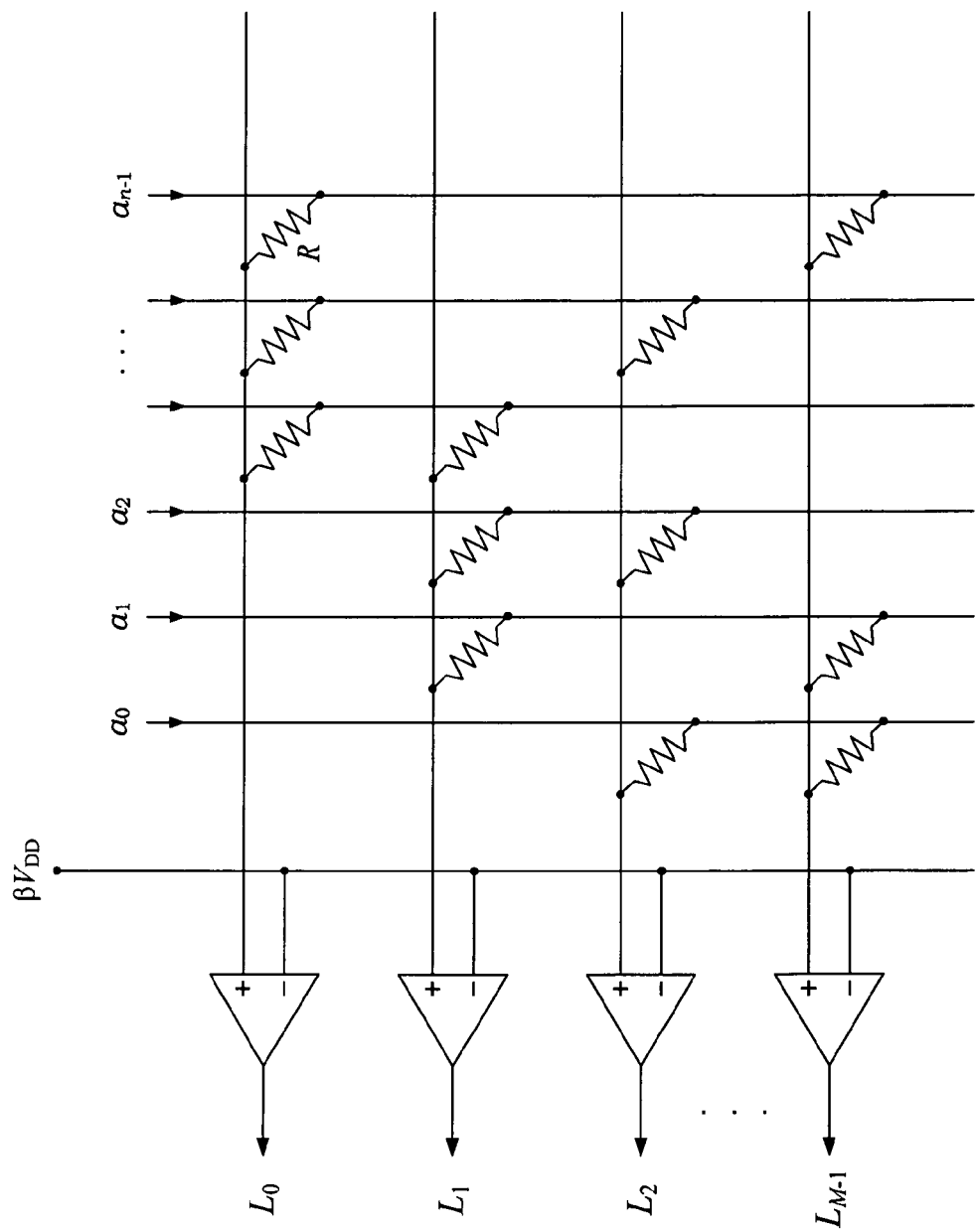
FIG. 14 shows a resistor-logic implementation of the demultiplexer crossbar shown in FIG. 8.

Resistor-Logic Implementation of a Defect-Tolerant Multiplexer that Represents One Embodiment of the Present Invention FIG. 14 shows a resistor-logic implementation of the demultiplexer crossbar shown in FIG. 8. The resistor-logic implementation is similar to the MOS-logic implementation, except that configured junctions are connected through resistors, there are no inverters on the internal address signal lines, and the reference voltage is now $\beta V_{DD}$ where $1 \geq \beta \geq 0$.

Figure 15:
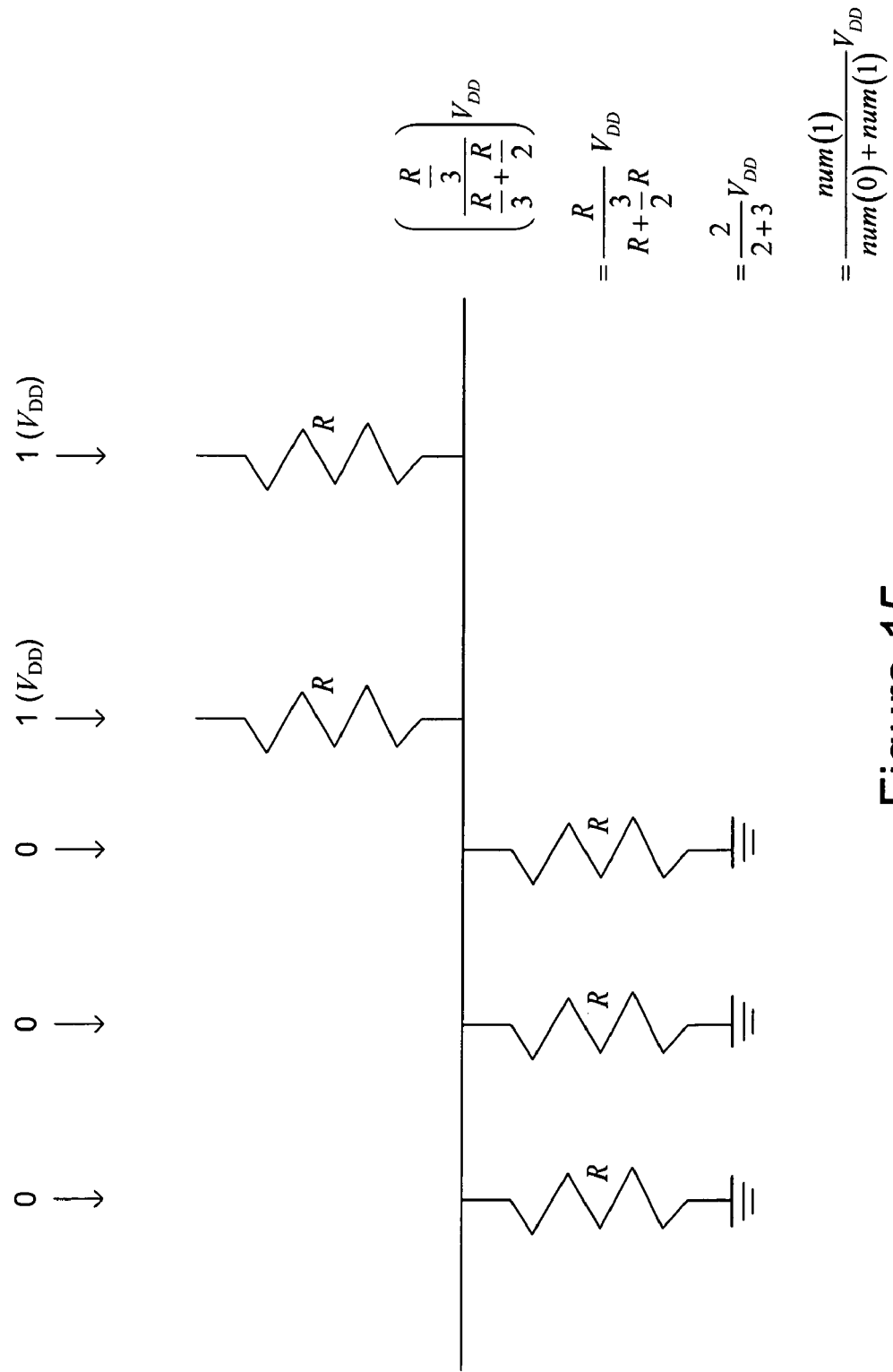
FIG. 15 shows, in a fashion analogous to FIG. 12, the voltage level of a horizontal demultiplexer-crossbar signal line when two configured internal address signal lines carry Boolean value "1" and three configured address signal lines carry Boolean value "0."

FIG. 15 shows, in a fashion analogous to FIG. 12, the voltage level of a horizontal demultiplexer-crossbar signal line when two configured internal address signal lines carry Boolean value "1" and three configured address signal lines carry Boolean value "0." Again, the horizontal demultiplexer-crossbar signal line operates as a tap into a voltage divider, where the voltage on the horizontal demultiplexer-crossbar signal line is equal to:

$$\frac{\text{number (1)}}{\text{number (0)} + \text{number (1)}} V_{DD}$$

where number(x) is the number of configured address signal lines that carry signal x.

Figure 16:
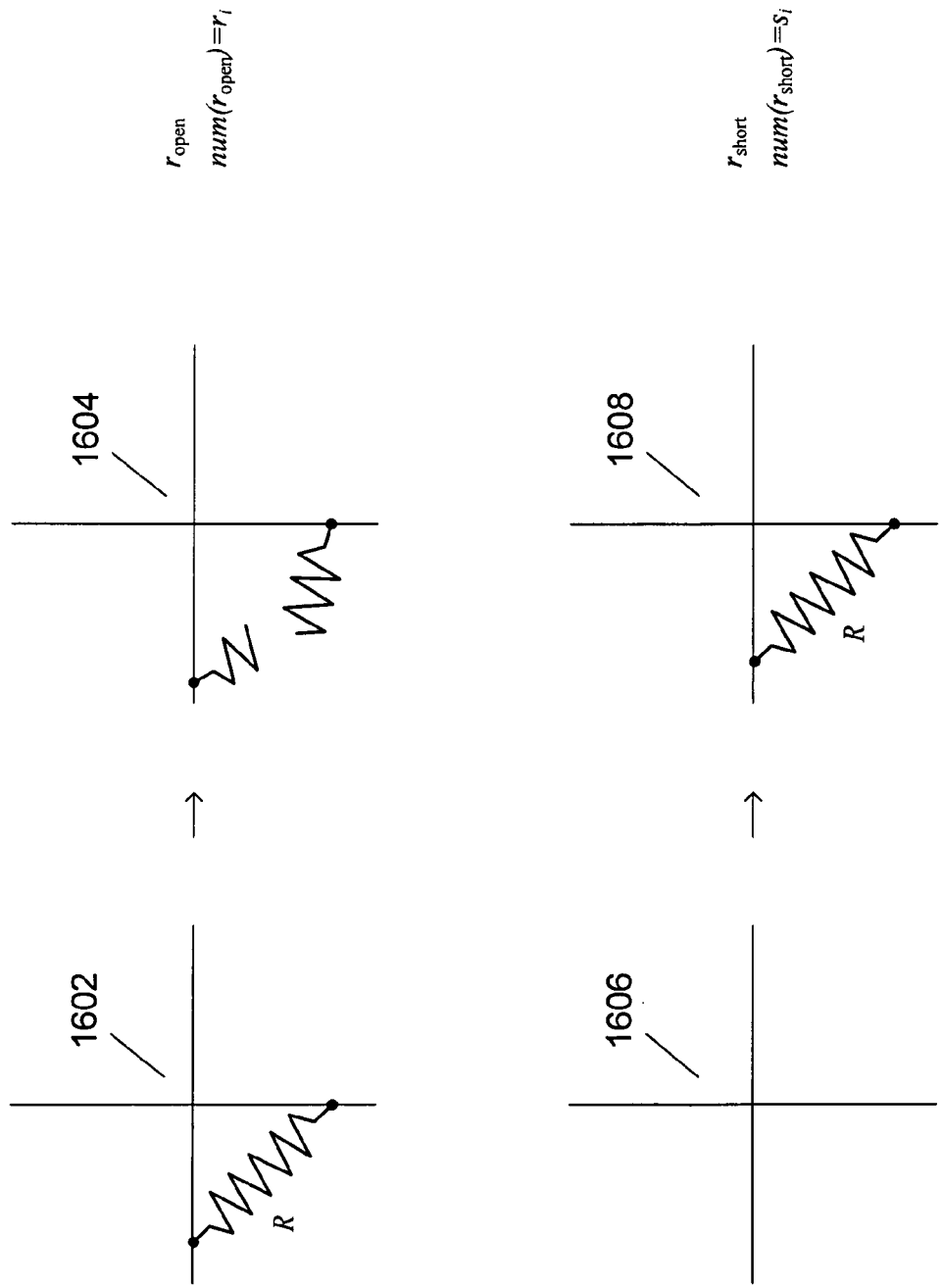
FIG. 16 shows the two different types of defects that may arise in a resistor-logic implementation of a demultiplexer crossbar.

In the resistor-logic implementation, two different types of defects are considered. FIG. 16 shows the two different types of defects that may arise in a resistor-logic implementation of a demultiplexer crossbar. A first type of defect, referred to as an $z_{open}$ defect, occurs when a configured junction 1602 is disconnected to produce an unconfigured junction 1604. The number of $z_{open}$ defects associated with a particular output signal line $L_i$ is referred to as "$r_i$." A second type of defect occurs when a non-configured junction 1606 is shorted through a resistance to produce a configured junction 1608. This type of defect is referred to as an $z_{short}$ defect, and the number of $z_{short}$ defects for a particular output signal line $L_i$ is referred to as "$s_i$."

A signal line is selected by address a when:

$$\frac{\langle h^i, a \rangle}{w(h^i)} = \frac{num(1)}{\sigma} \geq \frac{\beta V_{DD}}{V_{DD}} = \beta$$

Therefore:

$a^l$ selects $h^l$ when $w(a^l) \geq \beta w(h^i)$, assuming $a^l \leftarrow h^l$ to select $L_i$ $a^l$ deselects $h^i$ when $\langle h^i, a \rangle < \beta w(h^i)$ A constraint on the codes that can be used for configuration vectors for a resistor-based demultiplexer can be derived as:

$$\frac{\langle h^i, a' \rangle}{\langle h^i, a' \rangle + \langle h^i, \bar{a}' \rangle} < \beta$$

$$1 - \frac{\langle h^i, a' \rangle}{w(h^i)} > 1 - \beta$$

$$\frac{\langle h^i, \bar{a}' \rangle}{w(h^i)} > 1 - \beta$$

$\langle h^i, \bar{a}' \rangle > (1 - \beta) w(h^i)$ $d_u(C) > (1 - \beta) w(h^i)$ Just as with the MOS-logic-based demultiplexer crossbar, a resistor-based demultiplexer crossbar may include various different types of manufacturing defects. Two of the types of defects that are considered in the following equations are discussed above with reference to FIG. 16, namely $z_{open}$ and $z_{short}$ defects. Using an analysis similar to that used for the MOS-logic-based demultiplexer, it can be shown that, when configuration vectors are selected from a unisymmetric code $C=\{h^0, h^1, \ldots, h^{M-1}\}$ and when $\beta V_{DD}$ is the reference voltage, then when, $\forall i \in \{0,1,\ldots,M-1\}$, $(1-\beta)r_i+\beta s_i \leq (1-\beta)w(h^i)$

AND $\beta r_i+(1-\beta)s_i < d_u(C)-(1-\beta)w(h^i)$ the demultiplexer crossbar operates correctly. Assuming that the configuration vectors for the output signal lines are selected from a constant-weight code $C=(n,M,d,w)$, the voltage margin for a resistor-logic-based demultiplexer crossbar can be determined based on the set $\Im$ of all r and s pairs that meet the above defect-tolerance criteria with a reference voltage $\beta V_{DD}$, expressed as:

$$\Im = \left\{(r, s) \in N \times N : \frac{s}{w-r+s} \leq 1-\beta < \frac{\frac{d}{2}-r}{w-r+\tau}\right\}$$

Then:

$$\text{relative voltage margin} = \min_{(r,s) \in \Im}\left(\frac{\frac{d}{2}-r}{w-r+s}\right) - \max_{(r,s) \in \Im}\left(\frac{s}{w-r+s}\right)$$

$$= \frac{d}{2w} \text{ with no defects}$$

Figure 17:
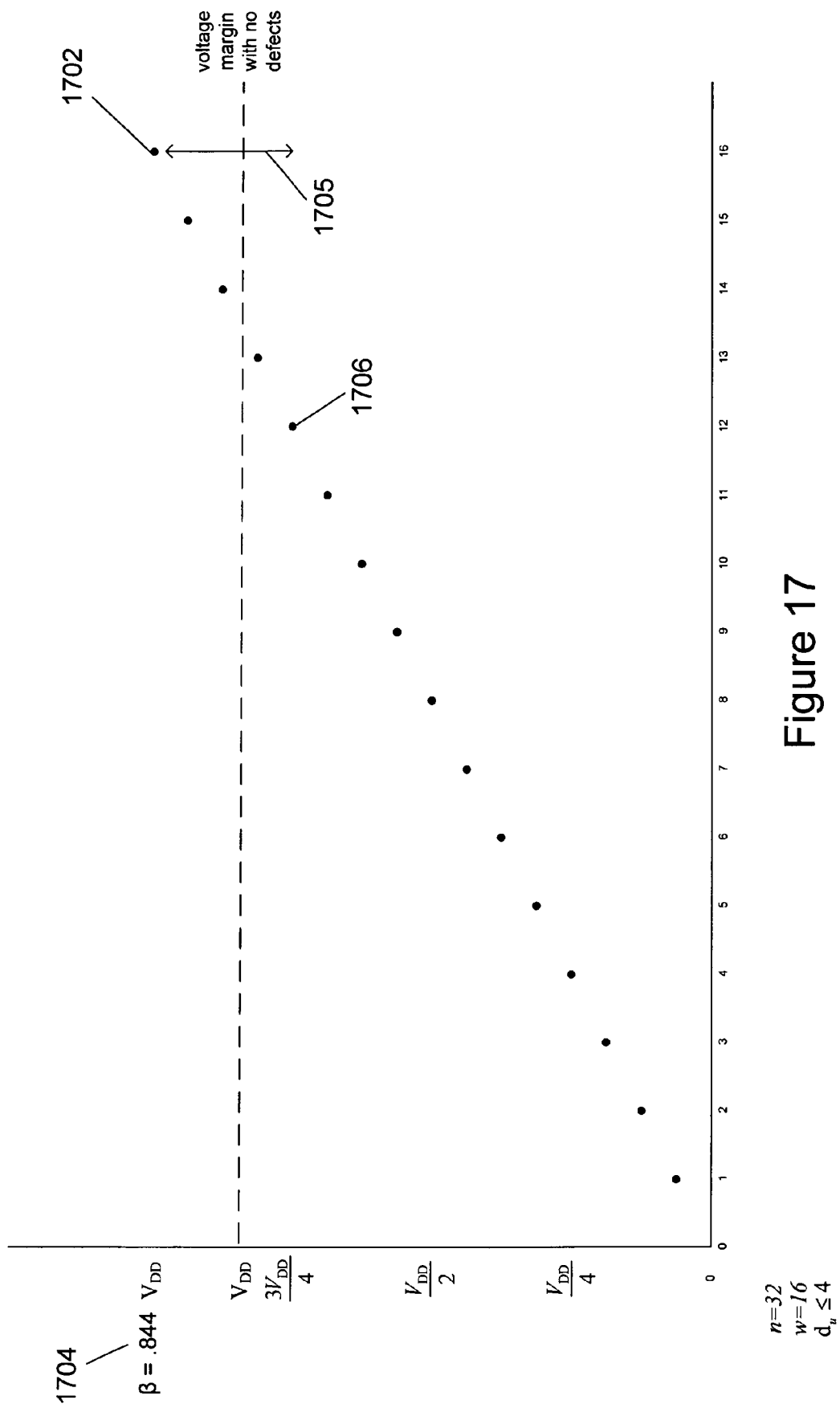
FIG. 17 shows, in a fashion similar to FIG. 13 for the MOS-logic-based demultiplexer crossbar, the voltages on a horizontal demultiplexer-crossbar signal line produced when Boolean value "1" is input to a varying number of the 16 configured junctions along the horizontal demultiplexer-crossbar signal line.

FIG. 17 shows, in a fashion similar to FIG. 13 for the MOS-logic-based demultiplexer crossbar, the voltages on a horizontal demultiplexer-crossbar signal line produced when Boolean value "1" is input to a varying number of the 16 configured junctions along the horizontal demultiplexer-crossbar signal line. When all 16 configured junctions are associated with internal address signal lines to which the Boolean value "1" is input, then the voltage on the horizontal demultiplexer-crossbar signal line is $V_{DD}$, as represented by point 1702 in FIG. 17. The voltage decreases linearly as increasing numbers of the configured junctions are associated with input values "0." For the example shown in FIG. 17, a constant weight code with w=16 and d=8 is used for generating the output signal line configurations, and the threshold voltage ratio β 1704 is set to 0.844. When no defects are present along the horizontal demultiplexer-crossbar signal line, the voltage margin, as discussed above, is $$\frac{d}{2w} = \frac{1}{4},$$

as indicated by arrow 1705 in FIG. 17. Clearly, when no defects are present, input of an address equal to the configuration vector for the horizontal demultiplexer-crossbar signal line results in the voltage of $V_{DD}$ output by the signal line to the comparator, well above the threshold of $0.844 V_{DD}$. When an address not equal to the configuration vector for the horizontal demultiplexer-crossbar signal line is input to the internal address signal lines, that address must differ from the configuration vector in at least four places, so the maximum voltage that the address can produce is the ratio $$\frac{3V_{DD}}{4},$$

represented by point 1706 in FIG. 17. As discussed above, when $z_{open}$ and $z_{short}$ defects are present, the voltage margin may decrease. When more than a threshold number of such defects are present, the input address not equal to the configuration vector for the horizontal demultiplexer-crossbar signal line may result in an output voltage greater than $\beta V_{DD}$ while input of an address equal to the configuration vector may result in an output voltage less than $\beta V_{DD}$.

Figure 18:
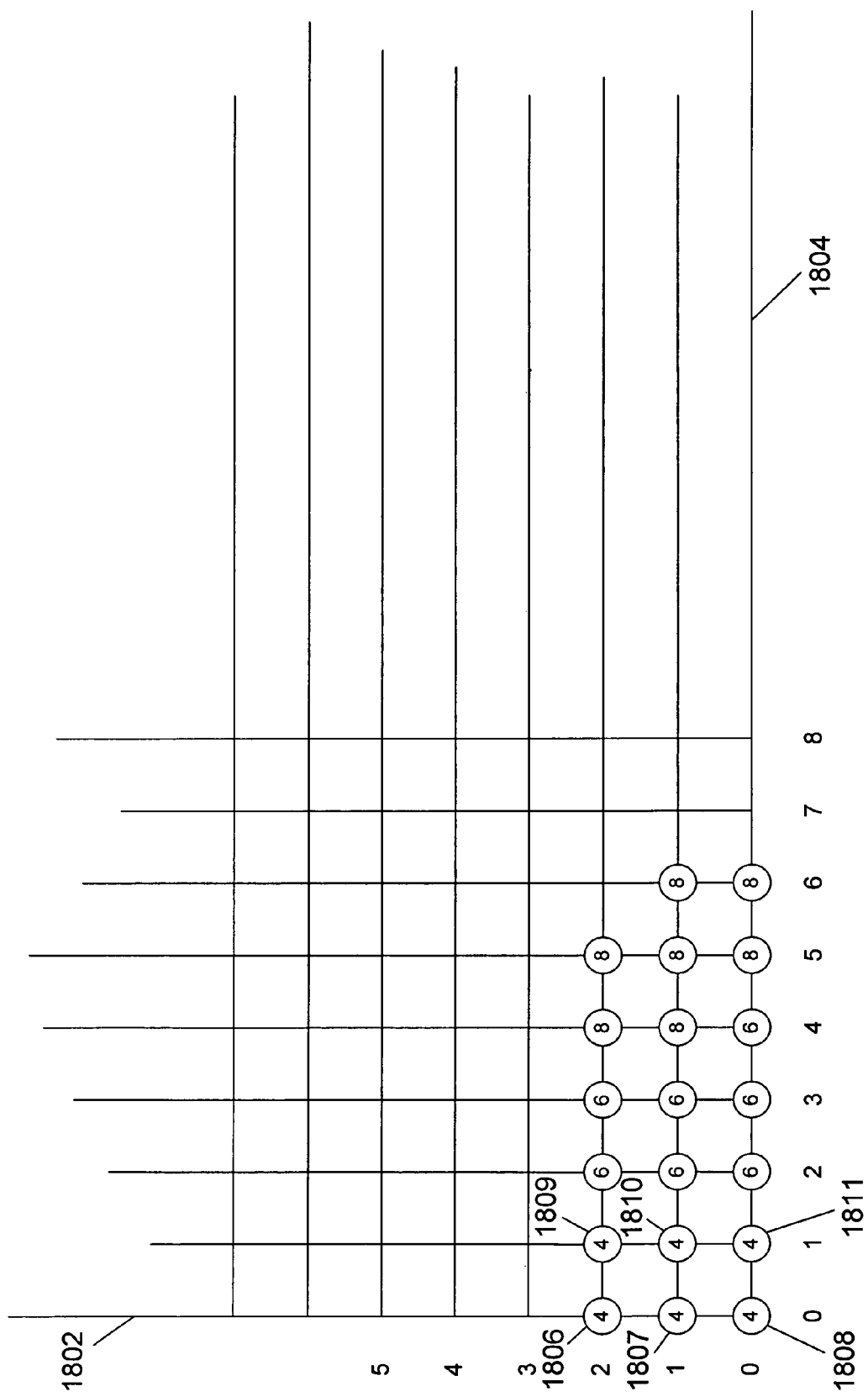
FIG. 18 shows, for the horizontal demultiplexer-crossbar signal line described with reference to FIG. 17, the effect of increasing the unisymmetric code distance of the code from which configuration vectors are selected.

FIG. 18 shows, for the horizontal demultiplexer-crossbar signal line described with reference to FIG. 17, the effect of increasing the unisymmetric code distance of the code from which configuration vectors are selected. FIG. 18 shows (r,s) defect numbers, with s plotted with respect to the vertical axis 1802 and r plotted with respect to the horizontal axis 1804, that can be tolerated by a fault-tolerant resistor-based demultiplexer crossbar. Using the parameters discussed with reference to FIG. 17 in the above equation for defect tolerance criteria, it is easily shown that a maximum of two $z_{short}$ defects, s=2, can be tolerated in the demultiplexer crossbar. As the unisymmetric distance $d_u$ is increased from 4 to 6 and then to 8, a larger number of (r, s) pairs satisfy the above defect-tolerance criteria. In FIG. 18, when $d_u=4$, the (r, s) pairs representing tolerated defects include those represented by the points 1806-1811. All points are labeled by the $d_u$ value "4." Increasing $d_u$ for the code from which the configuration vectors are selected to 6 adds seven additional (r,s) pairs, and further increasing the unisymmetric distance $d_u$ for the code to 8 adds an additional seven (r,s) pairs. Thus, increasing the unisymmetric distance $d_u$ for the code from which the configuration vectors are selected increases the defect tolerance of the demultiplexer crossbar, as would be expected since the configurations overlap less with one another as the unisymmetric distance increases.

Although the present invention has been described in terms of particular embodiments, it is not intended that the invention be limited to these embodiments. Modifications within the spirit of the invention will be apparent to those skilled in the art. For example, it is possible that many other implementations that can be modeled by TL gates of demultiplexer crossbars, in addition to the MOS-logic based and resistor-based implementations discussed above, can be devised. So long as these implementations can be modeled as TL-gate-based demultiplexer crossbars, they will exhibit the defect-tolerance criteria discussed above. TL-gate-based implementations of demultiplexer crossbars, and alternative implementations that can be modeled as TL-gate-based demultiplexer crossbars, provide simpler, more efficient implementations than current demultiplexer-crossbar implementations of various proposed types of demultiplexer-crossbar implementations. TL-gate-based demultiplexer crossbars, such as the MOS-logic-based demultiplexer crossbars discussed above, use fewer transistors per junction to achieve equivalent levels of fault tolerance. A variety of different types of codes may be used for generating configuration vectors for the horizontal demultiplexer-crossbar signal lines. Demultiplexer crossbars that represent embodiments of the present invention can have an arbitrary number of internal address signal lines and output signal lines, providing that suitable codes with suitable characteristics, as discussed above, can be found for the configuration vectors. Demultiplexer crossbars that represent embodiments of the present invention can be included as components in a variety of different types of demultiplexers which are, in turn, used in a variety of different applications within electronic devices and circuits. In addition, demultiplexer crossbars that represent embodiments of the present invention may find non-demultiplexer applications.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A fault-tolerant demultiplexer crossbar comprising:
a first set of parallel internal signal lines that comprise internal address signal lines through which an address is received by the fault-tolerant demultiplexer crossbar;
a second set of parallel internal signal lines that are each connected to an output signal line, each output signal line associated with a configuration vector that specifies to which signal lines of the first set of signal lines the output signal line is coupled through configured junctions, each configured junction connecting one signal line of the first set of signal lines to one signal line of the second set of signal lines; and
threshold logic elements, each associated with an output signal line, each of which outputs one of two different signals to the associated output signal line depending on the address received through the internal address signal lines, and each having a threshold greater than or equal to 1.

2. The fault-tolerant demultiplexer crossbar of claim 1
wherein an address received through the internal address signal lines is encoded by high and low states of the internal address signal lines modeled as Boolean "1" and Boolean "0" values within a Boolean vector, each Boolean value in the vector corresponding to the state of a corresponding internal address signal line;
wherein the configuration vectors, each associated with an output signal line, are Boolean vector, each Boolean value in each vector specifying whether or not an internal signal line is connected to the associated output signal line through a configured junction, with Boolean value "1" indicating connection through a configured junction and Boolean value "0" indicating no connection; and
wherein the two different signals output to each output signal line are referred to as Boolean "1" and Boolean "0" signals.

3. The fault-tolerant demultiplexer crossbar of claim 2
wherein n internal signal lines of the first set of parallel internal signal lines are each connected to a corresponding one of n internal address signal lines;
wherein each of M output signal lines $L_i$, where $i \in \{0, 1, 2, \ldots, M-1\}$ is associated with a configuration vector $h^i$;
wherein the configuration vectors $h^i$, where, $i \in \{0, 1, 2, \ldots, M-1\}$, are selected from a code C with unisymmetric distance $d_u(C)$, with codewords having length n; and
wherein, when there are no defects in the fault-tolerant demultiplexer crossbar, when $d_u(C) \geq 1$, and when a received address $a^j$ is identical to a configuration vector $h^j$, the demultiplexer crossbar outputs a Boolean "1" signal to all output signal lines associated with the configuration vector $h^j$ and outputs a Boolean "0" signal to all output signal lines associated with configuration vectors different from configuration vector $h^j$.

4. The fault-tolerant demultiplexer crossbar of claim 3
wherein each threshold logic element i corresponding output signal line $L_i$, where $i \in \{0, 1, 2, \ldots, M-1\}$, is a threshold-logic gate with $\sigma = w(h^i)$ inputs, where $w(h^i)$ is the number of Boolean value "1" elements in configuration vector $h^i$;
wherein each input to each threshold logic gate is connected through a configured junction to one of the internal signal lines of the first set of internal signal lines; and
wherein each threshold logic element outputs Boolean signal "1" Wand only if at least $\sigma-v$ of the $\sigma$ inputs carry Boolean "1" signals, where u is an input threshold for the threshold-logic gate.

5. The fault-tolerant demultiplexer crossbar of claim 4 wherein defects may occur in a threshold logic gate, the defects including:
a stuck-on defect in which an input to the threshold logic gate appears to continuously input only a Boolean "1" signal;
a stuck-off defect in which an input to the threshold logic gate appears to continuously input only a Boolean "0" signal; and
a short defect in which an additional, stuck-off defective input is added to the threshold gate.

6. The fault-tolerant demultiplexer crossbar of claim 5
wherein, for all $i \in \{0, 1, 2, \ldots, M-1\}$, threshold logic gate i has $r_i$ stuck-on defects, $s_i$ stuck-off defects, and $t_i$ short defects,
wherein, when, for all $i \in \{0, 1, 2, \ldots, M-1\}$, $s_i - t_i <= v$ and $r_i - t_i < d_u(C) - v$, reception of an address $a^j$ identical to configuration vector $h^j$ results in the fault-tolerant demultiplexer crossbar outputting Boolean signal "1" to all the demultiplexer crossbar output signal lines associated with the configuration vector $h^j$ and outputting Boolean "0" signal to all output signal lines associated with configuration vectors different from configuration vector $h^j$.

7. The fault-tolerant demultiplexer crossbar of claim 3 wherein, for $i \in \{0, 1, 2, \ldots, M-1\}$
each output signal line $L_i$ is output from a comparator i;
each comparator i receives a "−" input set to a threshold voltage θ and a "+" input from one internal signal line from the second set of signal lines connected through configured junctions to internal signal lines of the first set of internal signal lines according to the configuration vector for the output signal line $L_i$ and connected to a voltage source $V_{DD}$ through a resistor with resistance $R_{DD}$, each internal signal line of the first set of internal signal lines connected to one internal address signal line through an inverter;
each configured junction comprising a transistor with
source input connected to the internal signal line from the second set of signal lines,
gate input connected to one internal signal line from the second set of signal lines, and
drain output connected to ground through a resistor with resistance $R_S$, and
each comparator i outputs Boolean signal "1" if and only if the voltage at the "+" input ≧ the voltage at the "−" input.

8. The fault-tolerant demultiplexer crossbar of claim 7 wherein defects may occur in the fault-tolerant demultiplexer crossbar, the defects including:

a stuck-on defect in which the transistor of configured junction is closed regardless of the voltage at the input gate;

a stuck-off defect in which the transistor of configured junction is open regardless of the voltage at the input gate;

and a short defect in which the transistor of configured junction is shorted through a resistance $R_S$ to ground.

9. The fault-tolerant demultiplexer crossbar of claim 8 wherein, for all i∈{0, 1, 2, ..., M−1}, the comparator i and all configured junctions along the internal signal line connected to the "+" terminal of comparator i operate as a threshold logic gate;

wherein, for all i∈{0, 1, 2, ..., M−1}, the threshold logic gate comprising comparator i and all configured junctions along the internal signal line connected to the "+" terminal of comparator i has $r_i$ stuck-on defects, $s_i$ stuck-off defects, and $t_i$ short defects; and wherein, when, for all i∈{0, 1, 2, ..., M−1}, $s_i-t_i <= v$ and $r_i-t_i < d_u(C)-v$, reception of an address $a^j$ identical to configuration vector $h^j$ results in the fault-tolerant demultiplexer crossbar outputting Boolean signal "1" to all the demultiplexer crossbar output signal lines associated with the configuration vector $h^j$ and outputting Boolean "0" signal to all output signal lines associated with configuration vectors different from configuration vector $h^j$.

10. The fault-tolerant demultiplexer crossbar of claim 9 wherein threshold voltage θ is selected to be:

$$V_{DD}\left(\frac{R_S}{R_S + (\vartheta + 1)R_{DD}}\right) < \Theta \leq \left(\frac{R_S}{R_S + \vartheta R_{DD}}\right)V_{DD}$$

so that the threshold u of the threshold logic gate which characterizes operation of each comparator and all configured junctions along the internal signal line connected to the "+" terminal of comparator is:

$$\left(\frac{V_{DD}}{\Theta} - 1\right)\frac{R_S}{R_{DD}} \geq \vartheta > \left[\left(\frac{V_{DD}}{\Theta} - 1\right)\frac{R_S}{R_{DD}}\right] - 1.$$

11. The fault-tolerant demultiplexer crossbar of claim 3 wherein, for i∈{0, 1, 2, ..., M−1} each output signal line $L_i$ is output from a comparator i;

each comparator i receives a "−" input set to a threshold voltage $\beta V_{DD}$ and a "+" input from one internal signal line from the second set of signal lines connected through configured junctions to internal signal lines of the first set of internal signal lines according to the configuration vector for the output signal line $L_i$ and connected to a voltage source $V_{DD}$ through a resistor with resistance $R_{DD}$;

each configured junction comprising a resistor; and each comparator i outputs Boolean signal "1" if and only if the voltage at the "+" input ≧ the voltage at the "−" input.

12. The fault-tolerant demultiplexer crossbar of claim 11 wherein defects may occur in the fault-tolerant demultiplexer crossbar, the defects including:

a short defect in which an unconfigured junction is configured; and an open defect in which a configured junction becomes unconfigured.

13. The fault-tolerant demultiplexer crossbar of claim 12 wherein β is selected so that:

$$(1-\beta)\max w(h_i) < d_u(C).$$

14. The fault-tolerant demultiplexer crossbar of claim 13 wherein, for all i∈{0, 1, 2, ..., M−1}, the comparator i and all configured junctions along the internal signal line connected to the "+" terminal of comparator i operate as a threshold logic gate;

wherein, for all i∈{0, 1, 2, ..., M−1}, the threshold logic gate comprising comparator i and all configured junctions along the internal signal line connected to the "+" terminal of comparator i has $r_1$ open defects and $s_i$ short defects; and wherein, when, for all i∈{0, 1, 2, ..., M−1}, $(1-\beta)r_i+\beta s_i \leq (1-\beta)w(h_i)$ AND $\beta r_i+(1-\beta)s_i < d_u(C)-(1-\beta)w(h_i)$, reception of an address $a^j$ identical to configuration vector $h^j$ results in the fault-tolerant demultiplexer crossbar outputting Boolean signal "1" to all the demultiplexer crossbar output signal lines associated with the configuration vector $h^j$ and outputting Boolean "0" signal to all output signal lines associated with configuration vectors different from configuration vector $h^j$.

15. The fault-tolerant demultiplexer crossbar of claim 1 included within a demultiplexer comprising:

a number of external address signal lines;

an encoder that receives an external address the number of external address signal lines; and the fault-tolerant demultiplexer crossbar that receives, through the internal address signal lines connected to the encoder, an internal address generated by the encoder from the external address.

* * * * *

UNITED STATES PATENT AND TRADEMARK OFFICE
CERTIFICATE OF CORRECTION

| | | |
|---|---|---|
| PATENT NO. | : 7,899,091 B2 | Page 1 of 1 |
| APPLICATION NO. | : 12/288035 | |
| DATED | : March 1, 2011 | |
| INVENTOR(S) | : Ron M. Roth et al. | |

It is certified that error appears in the above-identified patent and that said Letters Patent is hereby corrected as shown below:

In column 19, line 60, in Claim 3, delete "where," and insert -- where --, therefor.

In column 20, line 15, in Claim 4, delete "Wand" and insert -- if and --, therefor.

In column 20, line 16, in Claim 4, delete "u" and insert -- v --, therefor.

In column 21, line 36, in Claim 10, delete "u" and insert -- v --, therefor.

Signed and Sealed this
Fifth Day of July, 2011

David J. Kappos
*Director of the United States Patent and Trademark Office*